(12) United States Patent
Johnson et al.

(10) Patent No.: US 7,381,650 B2
(45) Date of Patent: Jun. 3, 2008

(54) METHOD AND APPARATUS FOR PROCESS CONTROL IN TIME DIVISION MULTIPLEXED (TDM) ETCH PROCESSES

(75) Inventors: David Johnson, Palm Harbor, FL (US); Russell Westerman, Largo, FL (US); Mike Teixeira, Lutz, FL (US); Shouliang Lai, Tampa, FL (US)

(73) Assignee: Unaxis USA Inc., St. Petersburg, FL (US)

( * ) Notice: Subject to any disclaimer, the term of this patent is extended or adjusted under 35 U.S.C. 154(b) by 270 days.

(21) Appl. No.: 11/155,904

(22) Filed: Jun. 20, 2005

(65) Prior Publication Data

US 2005/0263485 A1 Dec. 1, 2005

Related U.S. Application Data

(63) Continuation-in-part of application No. 10/815,965, filed on Mar. 31, 2004, now Pat. No. 7,115,520.

(60) Provisional application No. 60/460,932, filed on Apr. 7, 2003.

(51) Int. Cl.
*H01L 21/461* (2006.01)
*H01L 21/302* (2006.01)
*G05D 7/00* (2006.01)

(52) U.S. Cl. .................. 438/706; 438/714; 137/102

(58) Field of Classification Search .................. 438/706
See application file for complete search history.

(56) References Cited

U.S. PATENT DOCUMENTS

| 4,253,480 | A | 3/1981 | Kessel et al. |
|---|---|---|---|
| 4,579,623 | A | 4/1986 | Suzuki et al. |
| 4,795,529 | A | 1/1989 | Kawasaki et al. |
| 5,501,893 | A | 3/1996 | Laermer et al. |
| 5,758,680 | A | 6/1998 | Kaveh et al. |
| 5,944,049 | A | 8/1999 | Beyer et al. |
| 6,051,053 | A | 4/2000 | Noji et al. |
| 6,119,710 | A | 9/2000 | Brown |
| 6,142,163 | A | 11/2000 | McMillin et al. |
| 6,284,148 | B1 | 9/2001 | Laermer et al. |
| 6,417,013 | B1 | 7/2002 | Teixeira et al. |
| 2002/0168467 | A1 | 11/2002 | Puech |
| 2003/0162410 | A1* | 8/2003 | Huang et al. ............ 438/780 |
| 2003/0211686 | A1* | 11/2003 | Panda et al. ............ 438/243 |

* cited by examiner

*Primary Examiner*—Nadine G. Norton
*Assistant Examiner*—Mahmoud Dahimene
(74) *Attorney, Agent, or Firm*—Harvey S. Kauget

(57) ABSTRACT

The present invention provides a method for controlling pressure in a chamber during a time division multiplexed process. A throttle valve is positioned based on an open-loop pressure control algorithm within at least one step of the time division multiplexed etch process. A pressure response of the step is evaluated and compared to a desired pressure response. The throttle valve is then positioned through a proportional, integral and derivative controller step to step of the time division multiplexed etch process based on the evaluation to the desired pressure response.

35 Claims, 26 Drawing Sheets

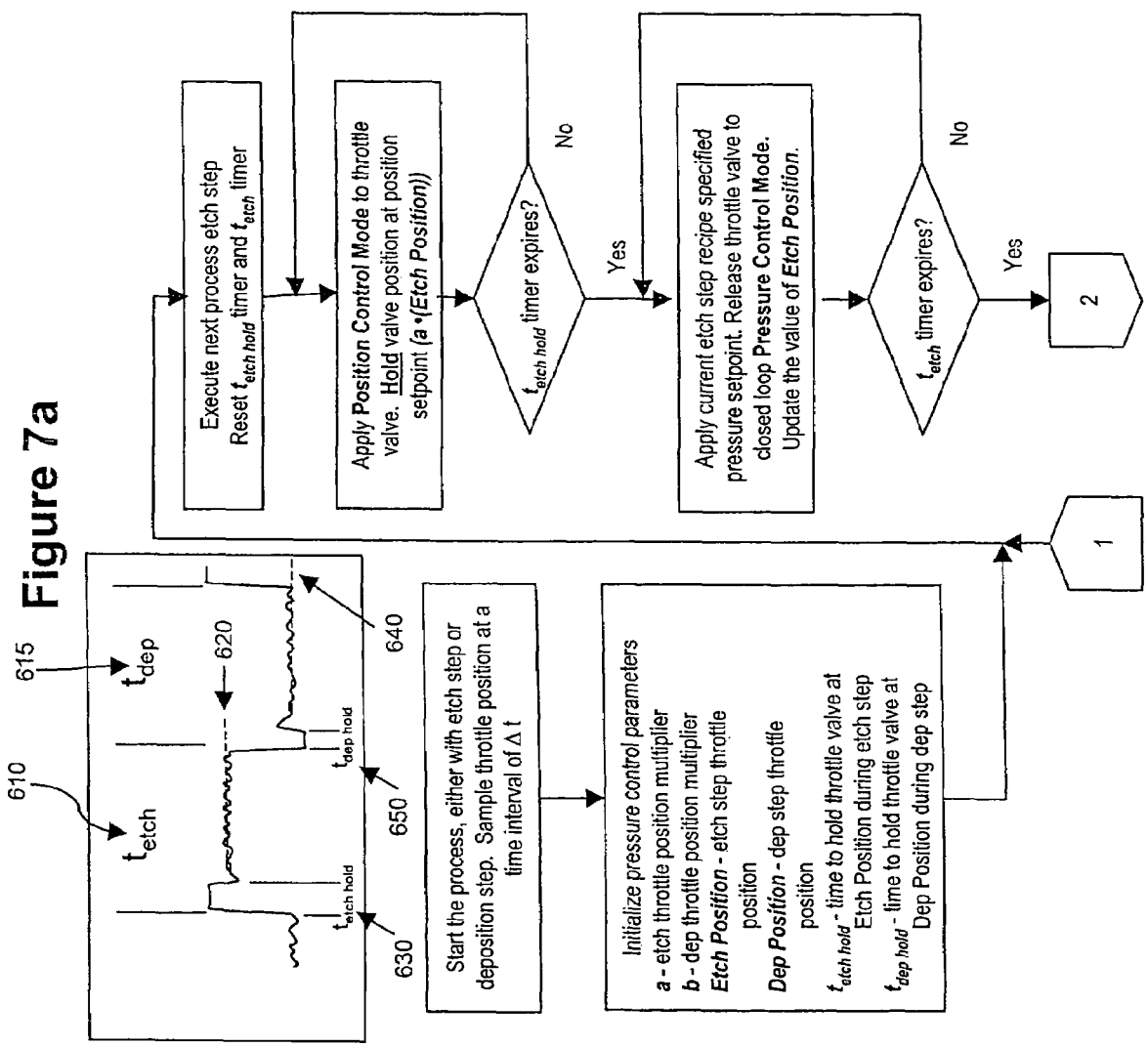

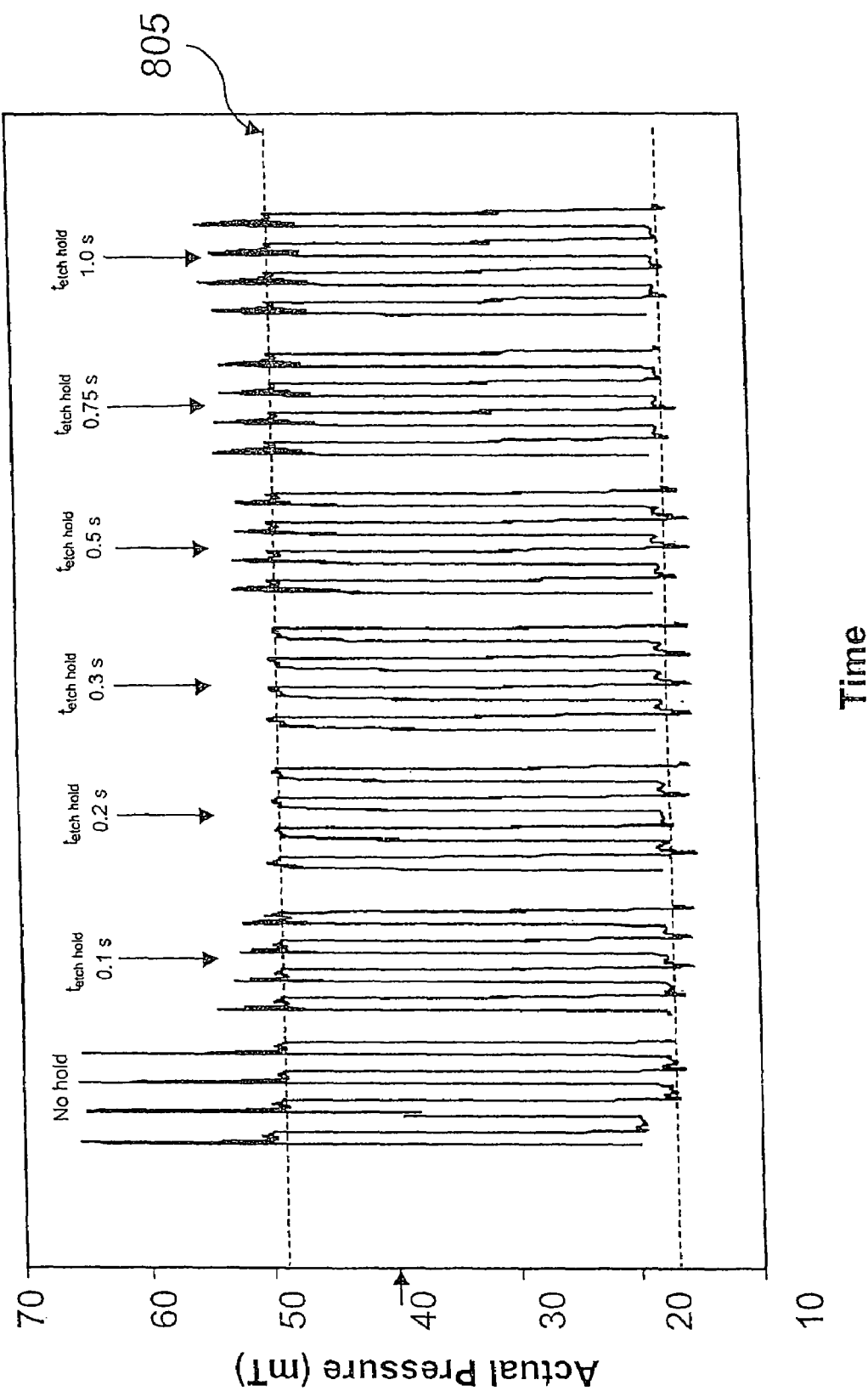

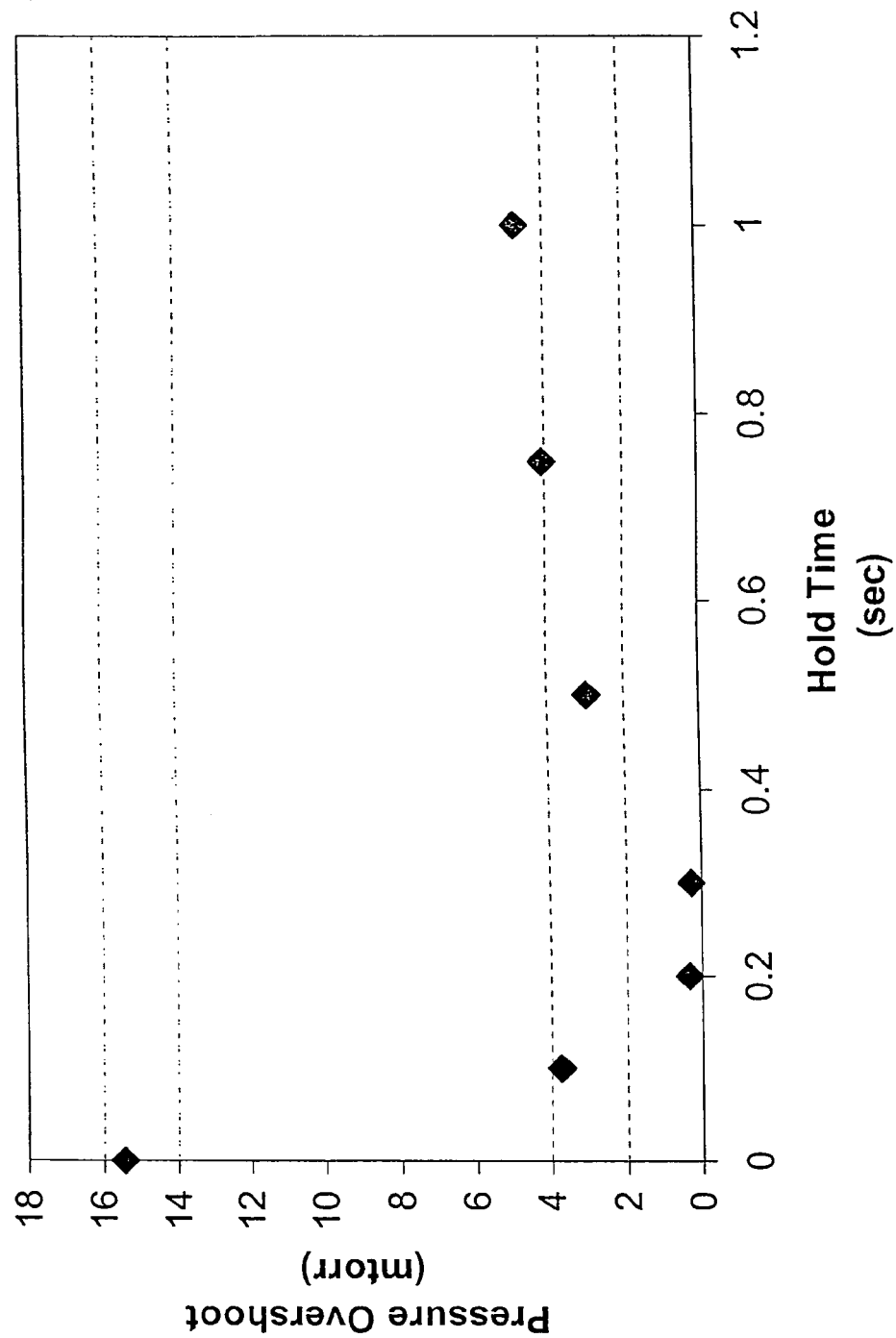

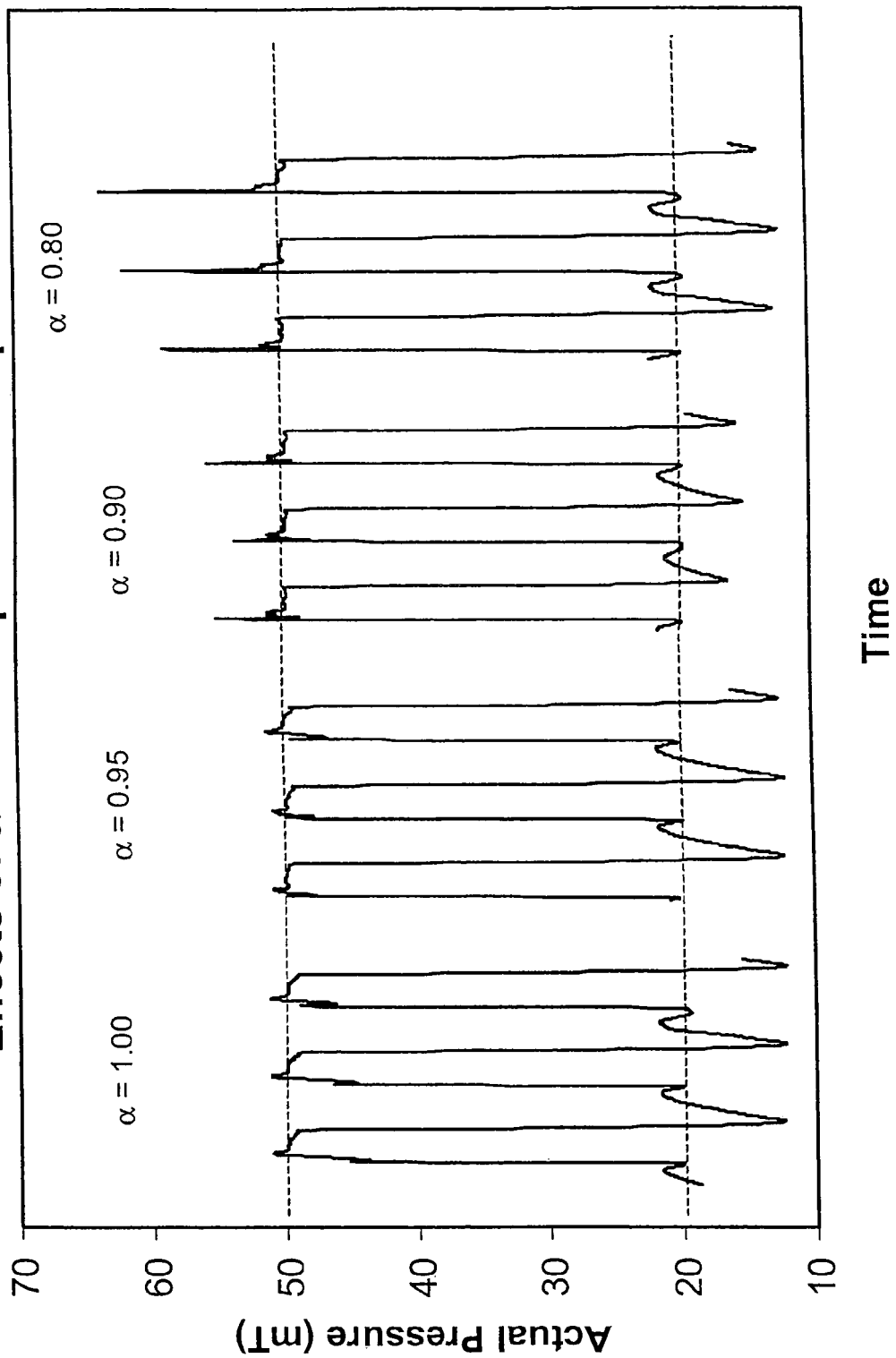

METHOD AND APPARATUS FOR PROCESS CONTROL IN TIME DIVISION MULTIPLEXED (TDM) ETCH PROCESSES

CROSS REFERENCE TO RELATED APPLICATIONS

This application claims priority from and is related to commonly owned U.S. Provisional Patent Application Ser. No. 60/460,932, filed Apr. 7, 2003, entitled: A Method and Apparatus for Process Control in Time Division Multiplexed (TDM) Etch Processes, this Provisional Patent Application incorporated by reference herein. This application is a continuation-in-part of application Ser. No. 10/815,965 filed on Mar. 31, 2004, now U.S. Pat. No. 7,115,520, entitled: A Method and Apparatus for Process Control in Time Division Multiplexed (TDM) Etch Processes, the contents of which are incorporated herein.

FIELD OF THE INVENTION

The present invention generally relates to the field of semiconductor wafer processing. More particularly, the present invention is directed to a method and apparatus for controlling the reaction chamber pressure during a time division multiplexed etching and deposition process.

BACKGROUND OF THE INVENTION

The fabrication of high aspect ratio features in silicon is used extensively in the manufacture of micro-electro-mechanical (MEMS) devices. Such features frequently have depths ranging from tens to hundreds of micrometers. To ensure manufacturability, the etching processes must operate at high etch rates to maintain reasonable throughputs, along with other performance requirements such as smooth etch profiles.

Conventional, single step, plasma etch processes cannot simultaneously meet these needs, and time division multiplex etch processes have been developed. Time division multiplexed (TDM) approaches for etching silicon have been described by Suzuki et al. (U.S. Pat. No. 4,579,623), Kawasaki et al. (U.S. Pat. No. 4,795,529) and Laermer et al. (U.S. Pat. No. 5,501,893). TDM etch processes typically employ alternating etching and deposition steps. For example, in etching a silicon (Si) substrate, sulfur hexafluoride ($SF_6$) is used as the etch gas and octofluorocyclobutane ($C_4F_8$) as the deposition gas. In an etch step, $SF_6$ facilitates spontaneous and isotropic etching of silicon (Si); in a deposition step, $C_4F_8$ facilitates protective polymer passivation onto the sidewalls as well as the bottom of the etched structures. In the subsequent etching step, upon energetic and directional ion bombardment, the polymer film coated in the bottom of etched structures from the preceding deposition step will be removed to expose the silicon surface for further etching. The polymer film on the sidewall will remain, inhibiting lateral etching. TDM processes cyclically alternate between etch and deposition process steps to enable high aspect ratio structures to be defined into a masked silicon substrate at high etch rates.

In each process step, gases (for example, $SF_6$ and $C_4F_8$) are introduced into the reaction chamber through a gas inlet at flow rates specified in the process recipe. TDM etch process are typically performed in high density plasma reactors (e.g., inductively coupled plasma (ICP), electron cyclotron resonance (ECR), etc.).

TDM process recipes consist of a series of process loop(s) and steps. Each loop consists of two or more process steps controlling the process variables (e.g., gas flow rates, chamber pressure, RF powers, process step times, chamber temperature, wafer temperature, etc.). The steps within a loop are repeated a number of times before executing the next step or loop in the overall process recipe. It is known to make changes to the process step parameters as a loop repeats to improve etch performance, this is known in the art as process morphing (see Teixeira et al. U.S. Pat. No. 6,417,013).

Pressure control is an important component of etching and deposition processes. The flow rate and pressure of the process gases present in the chamber must be carefully controlled to provide the desired deposition and etch characteristics for a repeatable manufacturing process.

A TDM plasma reactor evacuation system typically comprises a turbo pump separated from the reaction chamber by a throttle valve. A pressure controller uses reactor chamber pressure data from a manometer to control a throttle valve. The controller opens or closes the throttle valve to increase or decrease the vacuum supplied from the turbo pump to the reaction chamber. In this manner, the controller maintains the desired pressure in the reaction chamber. During the TDM process chamber pressure set points and gas flow rates cyclically alternate within the process loops. The gas flows can be either single component or mixtures of multiple components. The pressure controller must adjust the throttle valve position to compensate for these changing flow and pressure conditions. Ideally, the pressure controller adjusts the throttle valve position to instantly achieve the pressure set point without pressure set point overshoot or undershoot.

Throttle valves and controllers, currently available, typically operate in either Pressure Control mode or Position Control mode. In the Pressure Control mode the controller monitors the pressure in the reaction chamber and maintains the set point pressure by adjusting the position of the throttle valve (i.e., closed loop pressure control). In position control mode the controller positions the throttle valve to a set point position without monitoring the chamber pressure (i.e., open loop pressure control).

A number of groups have looked at means for process control in plasma chambers. Kessel et al. (U.S. Pat. No. 4,253,480) describes a pressure regulator that employs an adjustable solenoid valve to control pressure. Kessel teaches the fundamental mechanism dictating the operations of many throttle valves used in vacuum chambers. The actual pressure in a container is measured and converted to electrical signals. A comparator generates a regulation signal that represents the difference between the actual pressure and a command pressure. A regulator uses the regulation signal to direct the valve in such a manner that the valve member is adjustable between intermediate positions within a range between the open and closed positions of the valve. In fact, the throttle valves used in TDM process tools are operated following such principles. However, as described earlier, the inability to control pressure during the transition of the constantly alternating TDM process steps is the real issue, and cannot be addressed by Kessel's technique.

Kaveh et al. (U.S. Pat. No. 5,758,680) and McMillin et al. (U.S. Pat. No. 6,142,163) describe the use of a ballast port for inserting gas into the evacuation system to compensate the pressure fluctuations in the reaction chamber so as to minimize throttle valve movement between different process steps. They further disclose a method to reduce the time for gas stabilization in a vacuum chamber. A throttle valve is first pre-positioned to the desired position. The desired position is estimated using pre-determined estimation curves. Then for a specified period of time, proportional and derivative (PD) control is enabled to control throttle valve movement. Then proportional, integral and derivative (PID) control is enabled to regulate throttle valve movement. The examples taught in the disclosure show that the time period for pressure stabilization is reduced from ~20 seconds to at least 3-5 seconds. While Kaveh and McMillin contemplate the change of gas flow rates and pressures when process steps change from one to the next, the use in cyclical and alternating TDM processes is not taught. Additionally, many TDM processes employ alternating process steps which last only a few seconds or shorter, which makes pressure control impractical using the disclosed technique.

Brown et al. (U.S. Pat. No. 6,119,710) describes the use of adjustable gas flow into the reaction chamber to compensate the pressure variations in the chamber. However, in many TDM processes, changing process gas flow rate during a process step is undesirable.

Beyer et al. (U.S. Pat. No. 5,944,049) describes regulating chamber pressure by controlling either the exhaust pressure at the exhaust side of a vacuum pump or the internal pressure at a compression stage of the first vacuum pump. Adjustments on vacuum pumping speed or injection of inert gas into the exhaust side or the compression stage of a vacuum pump are used to control reaction chamber pressure. Beyer does not teach how to use this technique in TDM processes.

Puech (U.S. Patent Application 20020168467) describes a way to control pressure by injecting passive control gas at a complementary flow rate into an area near the evacuation port. The flow rate of the controlled passive gas is regulated so as to maintain the total gas flow into the vacuum enclosure at a substantially constant rate. While Puech teaches the control of pressure in the TDM processes that employ process steps on the order of one second, the method does not teach the use of actively regulating throttle valve in pressure control.

The current methods of pressure control for TDM processes, Pressure Control and Position Control, have limitations. One problem with pressure control mode in a TDM process is that, in practice, there is typically a trade off between achieving fast pressure response time while minimizing set point deviations. Fast response times are possible at the expense of a period of pressure set point overshoot. Optimizing available Pressure Control mode algorithms to minimize set point overshoot results in slow response times. As the TDM step durations decrease, the time spent trying to reach the recipe specified set point becomes a significant fraction of the processing time.

A problem with the current method of Position Control mode in a TDM process is unacceptably long pressure response times. While position mode minimizes process overshoot, the slower response times result in the chamber pressure spending a large fraction of the process time approaching the requested set point value (i.e., out of compliance with the recipe specified set point).

Another problem with the position control mode method is that it is an open loop pressure control algorithm. Therefore, there is not any correction for perturbations in gas flow or pumping efficiency. These perturbations tend to cause the process pressure, and subsequent process performance, to vary with time.

Therefore, there is a need for a pressure control means for TDM processes, preferably for those processes that employ process steps that are a few seconds or less in duration.

Nothing in the prior art provides the benefits attendant with the present invention.

Therefore, it is an object of the present invention to provide an improvement which overcomes the inadequacies of the prior art devices and which is a significant contribution to the advancement of the semiconductor processing art.

Another object of the present invention is to provide a method for anisotropically etching a feature in a substrate comprising the steps of: subjecting the substrate to an alternating cyclical process within a plasma chamber, said alternating cyclical process having an etching step and a deposition step; introducing into said plasma chamber a first process gas for depositing a film onto the substrate during the deposition step of said alternating cyclical process; introducing into said plasma chamber a second process gas for etching the substrate during the etching step of said alternating cyclical process; regulating pressure of said plasma chamber by setting a throttle valve at a predetermined position set point for a predetermined period of time during at least one step of said alternating cyclical process; igniting a plasma for a recipe period of time for the deposition step of said alternating cyclical process and the etching step of said alternating cyclical process; enabling a closed loop pressure control algorithm after said predetermined period of time expires; and controlling pressure at a recipe specified pressure set point in said plasma chamber through a closed loop pressure control for a period that lasts the remaining time of the step.

Yet another object of the present invention is to provide a method of pressure control in a time division multiplex process comprising the steps of: regulating a process pressure in a vacuum chamber in at least one step of the time division multiplex process by setting a throttle valve at a predetermined position set point for a predetermined period of time; introducing into said vacuum chamber at least one process gas; enabling a closed loop pressure control algorithm after said predetermined period of time expires; and controlling pressure at a recipe specified pressure set point through a closed loop pressure control for a period that lasts the remaining time of said step of the time division multiplex process.

Still yet another object of the present invention is to provide a method for controlling pressure in a vacuum chamber, the method comprising the steps of: regulating a process pressure in the vacuum chamber by setting a throttle valve at a predetermined position set point for a predetermined period of time; introducing into said vacuum chamber a gas; enabling a closed loop pressure control algorithm after said predetermined period of time expires; and controlling pressure at a recipe specified pressure set point in said vacuum chamber through a closed loop pressure control.

Another object of the present invention is to provide a method of controlling pressure in a chamber during an etch process, the method comprising: placing a substrate in the chamber; executing a time division multiplexed etch process within the chamber; positioning a throttle valve based on an open-loop pressure control algorithm within at least one step of said time division multiplexed etch process; positioning said throttle valve based on a closed-loop pressure control algorithm from step-to-step of said time division multiplexed etch process; and removing said substrate from the chamber.

Yet another object of the present invention is to provide a method of controlling pressure in a chamber during an etch process, the method comprising: placing a substrate in the chamber; executing a time division multiplexed etch process within the chamber; positioning a throttle valve to a predetermined position within at least one step of said time division multiplexed etch process; maintaining said predetermined position of said throttle valve for a predetermined period of time; repositioning said throttle valve to a recipe specified position for the remainder of said step of said time division multiplexed etch process; and removing said substrate from the chamber.

Still yet another object of the present invention is to provide a method of controlling pressure in a chamber during an etch process, the method comprising: placing a substrate in the chamber; executing a time division multiplexed etch process within the chamber; controlling a throttle valve through a throttle preset parameter within at least one step of said time division multiplexed etch process; evaluating a pressure response of said step compared to a desired pressure response; applying a control algorithm to modify said throttle preset parameter step to step of said time division multiplexed etch process based on said evaluation step; and removing said substrate from the chamber.

Another object of the present invention is to provide a method of controlling process execution during an etch process, the method comprising: placing a substrate in the chamber; executing a time division multiplexed etch process within the chamber; modifying an execution timing of a subset of recipe parameters in at least one step of said time division multiplexed etch process; and removing said substrate from the chamber.

Yet another object of the present invention is to provide a method of controlling pressure in a chamber during an etch process, the method comprising: placing a substrate in the chamber; executing a time division multiplexed etch process within the chamber; controlling a throttle valve through a throttle preset parameter within at least one step of said time division multiplexed etch process; evaluating a pressure response of said step compared to a desired pressure response; applying a first control algorithm to modify said throttle preset parameter step to step of said time division multiplexed etch process based on said evaluation step; positioning said throttle valve based on a second control algorithm from step-to-step of said time division multiplexed etch process; and removing said substrate from the chamber.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a method and an apparatus for controlling the pressure in a vacuum chamber during a TDM process.

A feature of the present invention is to provide a method for anisotropically etching a feature in a substrate. The method comprising the following steps. The substrate is placed within a plasma chamber and subjected to an alternating cyclical process having an etching step and a deposition step. The pressure of the plasma chamber is regulated by setting a throttle valve at a predetermined position set point for a predetermined period of time to ensure that the chamber pressure does not overshoot or undershoot the desired operating level while minimizing the time required to reach the set point value. A first process gas, such as octofluorocyclobutane, is introduced into the plasma chamber for depositing a film onto the substrate during the deposition step of the alternating cyclical process. A plasma is ignited for a recipe period of time for the deposition step of the alternating cyclical process. A closed loop pressure control algorithm is enabled after the predetermined period of time expires. Then, the pressure of the plasma chamber is controlled at a recipe specified pressure set point through a closed loop pressure control for the remaining time of the deposition step. Next, the pressure of the plasma chamber is again regulated by setting the throttle valve at a predetermined position set point for a predetermined period of time to ensure that the chamber pressure does not overshoot or undershoot the desired operating level while minimizing the time required to reach the set point value. A second process gas, such as sulfur hexafluoride is introduced into the plasma chamber for etching the substrate during the etching step of the alternating cyclical process. A plasma is ignited for a recipe period of time for the etching step of the alternating cyclical process. A closed loop pressure control algorithm is enabled after the predetermined period of time expires. Then, the pressure of the plasma chamber is controlled at a recipe specified pressure set point through a closed loop pressure control for the remaining time of the etching step.

The predetermined position set point can either be set or derived from the following:

1. A throttle valve position of a preceding like step of the alternating cyclical process;

2. An average valve position of a plurality of preceding like steps of the alternating cyclical process; or 3. Prior calibration experiments.

The predetermined position set point can be adjusted by an offset from the throttle valve position of the preceding like step of the alternating cyclical process. The predetermined position set point can change using a predefined function for the duration of the predetermined period of time. The predetermined position set point can be modified based on pressure performance of a preceding like step of the alternating cyclical process such as minimizing the time to reach the recipe specified pressure set point or minimizing the deviation from the recipe specified pressure set point.

The predetermined period of time is about 0.05 to 0.5 seconds long. The predetermined period of time can be modified based on pressure performance of a preceding like step of the alternating cyclical process such as minimizing the time to reach the recipe specified pressure set point or minimizing the deviation from the recipe specified pressure set point.

Yet another feature of the present invention is to provide a method of pressure control in a time division multiplex process. The method comprising the following steps. The process pressure in a vacuum chamber is regulated in at least one step of the time division multiplex process by setting a throttle valve at a predetermined position set point for a predetermined period of time to ensure that the chamber pressure does not overshoot or undershoot the desired operating level while minimizing the time required to reach the set point value. At least one process gas is introduced into the vacuum chamber for processing a substrate according to the time division multiplex process. A closed loop pressure control algorithm is enabled after the predetermined period of time expires. Then, the pressure of the vacuum chamber is controlled at a recipe specified pressure set point through a closed loop pressure control algorithm for a period that lasts the remaining time of the processing step of the time division multiplex process.

Still yet another feature of the present invention is to provide a method for controlling pressure in a vacuum chamber. The method comprising the following steps. The process pressure of the vacuum chamber is regulated by setting a throttle valve at a predetermined position set point for a predetermined period of time to ensure that the chamber pressure does not overshoot or undershoot the desired operating level while minimizing the time required to reach the set point value. A gas is introduced into the vacuum chamber. A closed loop pressure control algorithm is enabled after the predetermined period of time expires. Then, the pressure is controlled at a recipe specified pressure set point in the vacuum chamber through a closed loop pressure control algorithm.

Another feature of the present invention is to provide a method of controlling pressure in a chamber during an etch process. The method comprising the following steps. A substrate is placed in the chamber. A time division multiplexed etch process is executed within the chamber. The time division multiplexed etch process having a step of depositing a passivation layer onto the substrate by means of a plasma and a step of etching a material from the substrate by means of a plasma. A process loop is performed where the deposition step and the etch step are repeated. A throttle valve is positioned based on an open-loop pressure control algorithm within at least one step of the time division multiplexed etch process. The open loop pressure control algorithm can be a throttle valve position control which can hold the throttle valve in a constant position within a step of the time division multiplexed etch process. The throttle valve position control can be based on a function of time which can be linear or nonlinear. The throttle valve is then positioned based on a closed-loop pressure control algorithm from step-to-step of the time division multiplexed etch process. The closed-loop pressure control can be a proportional, integral and derivative controller. Finally, the substrate is removed from the chamber.

Yet another feature of the present invention is to provide a method of controlling pressure in a chamber during an etch process. The method comprising the following steps. A substrate is placed in the chamber. A time division multiplexed etch process is executed within the chamber. The time division multiplexed etch process having a step of depositing a passivation layer onto the substrate by means of a plasma and a step of etching a material from the substrate by means of a plasma. A process loop is performed where the deposition step and the etch step are repeated. A throttle valve is positioned to a predetermined position within at least one step of the time division multiplexed etch process. The throttle valve is maintained in the predetermined position for a predetermined period of time to ensure that the chamber pressure does not overshoot or undershoot the desired operating level while minimizing the time required to reach the set point value. The predetermined position can be derived from a recipe position set point, be proportional to the recipe position set point, or is offset from the recipe position set point. The predetermined period of time can be less than a period of time for the step of the time division multiplexed etch process. Then, the throttle valve is repositioned to a-recipe specified position for the remainder of the step of the time division multiplexed etch process. Finally, the substrate is removed from the chamber.

Still yet another feature of the present invention is to provide a method of controlling pressure in a chamber during an etch process. The method comprising the following steps. A substrate is placed in the chamber. A time division multiplexed etch process is executed within the chamber. The time division multiplexed etch process having a step of depositing a passivation layer onto the substrate by means of a plasma and a step of etching a material from the substrate by means of a plasma. A process loop is performed where the deposition step and the etch step are repeated. A throttle valve is controlled through a throttle preset parameter within at least one step of the time division multiplexed etch process to ensure that the chamber pressure does not overshoot or undershoot the desired operating level while minimizing the time required to reach the set point value. The preset parameter can be a throttle position or a preset hold time duration. A pressure response of the step is evaluated and compared to a desired pressure response. The desired pressure response can be a step function. A control algorithm is applied to modify the throttle preset parameter step to step of the time division multiplexed etch process based on the evaluation step. The control algorithm can be closed-loop pressure control which can be a proportional, integral and derivative controller. Finally, the substrate is removed from the chamber.

Another feature of the present invention is to provide a method of controlling process execution during an etch process. The method comprising the following steps. A substrate is placed in the chamber. A time division multiplexed etch process is executed within the chamber. The time division multiplexed etch process having a step of depositing a passivation layer onto the substrate by means of a plasma and a step of etching a material from the substrate by means of a plasma. A process loop is performed where the deposition step and the etch step are repeated. An execution timing of a subset of recipe parameters in at least one step of the time division multiplexed etch process is modified. The modification to the execution timing can be an initiation of set point transition or a set point duration. The modification of the execution timing can change the execution order of at least two process variables. Finally, the substrate is removed from the chamber.

Yet another feature of the present invention is to provide a method of controlling pressure in a chamber during an etch process. The method comprising the following steps. A substrate is placed in the chamber. A time division multiplexed etch process is executed within the chamber. The time division multiplexed etch process having a step of depositing a passivation layer onto the substrate by means of a plasma and a step of etching a material from the substrate by means of a plasma. A process loop is performed where the deposition step and the etch step are repeated. A throttle valve is controlled through a throttle preset parameter within at least one step of the time division multiplexed etch process to ensure that the chamber pressure does not overshoot or undershoot the desired operating level while minimizing the time required to reach the set point value. The preset parameter can be a throttle position or a preset hold time duration. A pressure response of the step is evaluated and compared to a desired pressure response. The desired pressure response can be a step function. A first control algorithm is applied to modify the throttle preset parameter step to step of the time division multiplexed etch process based on the evaluation step. The first control algorithm can be a first closed-loop pressure control which can be a first proportional, integral and derivative controller. Then, the throttle valve is repositioned based on a second control algorithm from step-to-step of the time division multiplexed etch process. The second control algorithm can be a second closed-loop pressure control which can be a second proportional, integral and derivative controller. Finally, the substrate is removed from the chamber.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 7a is a block diagram explaining the control system of an embodiment of the present invention;

FIG. 8 is a graph of pressure versus time for experimental examples when the process control method of the present invention is implemented for various input values;

FIG. 9 is a graph showing optimization of one of the input values of the present invention;

FIG. 10 is a graph of pressure versus time for experimental examples when the process control method of the present invention is implemented for various input values.

Similar reference characters refer to similar parts throughout the several views of the drawings.

DETAILED DESCRIPTION OF THE INVENTION

We disclose a means of controlling pressure in a TDM, or any alternating step process, through a "Hold and Release" method. A throttle valve is pre-positioned when a process step is switched to the next process step. A control system is implemented to automatically set the position value at which the throttle valve is pre-positioned. The set position is derived from the throttle valve position in the preceding process steps of the same type. For a pre-determined period of time the throttle valve is held at the set position. After the holding period, the throttle valve is released, and a closed loop feedback control algorithm (e.g., PID loop) is enabled for the throttle valve to regulate the pressure in a vacuum chamber in the pressure control mode. The control system and method are disclosed.

Figure 1:
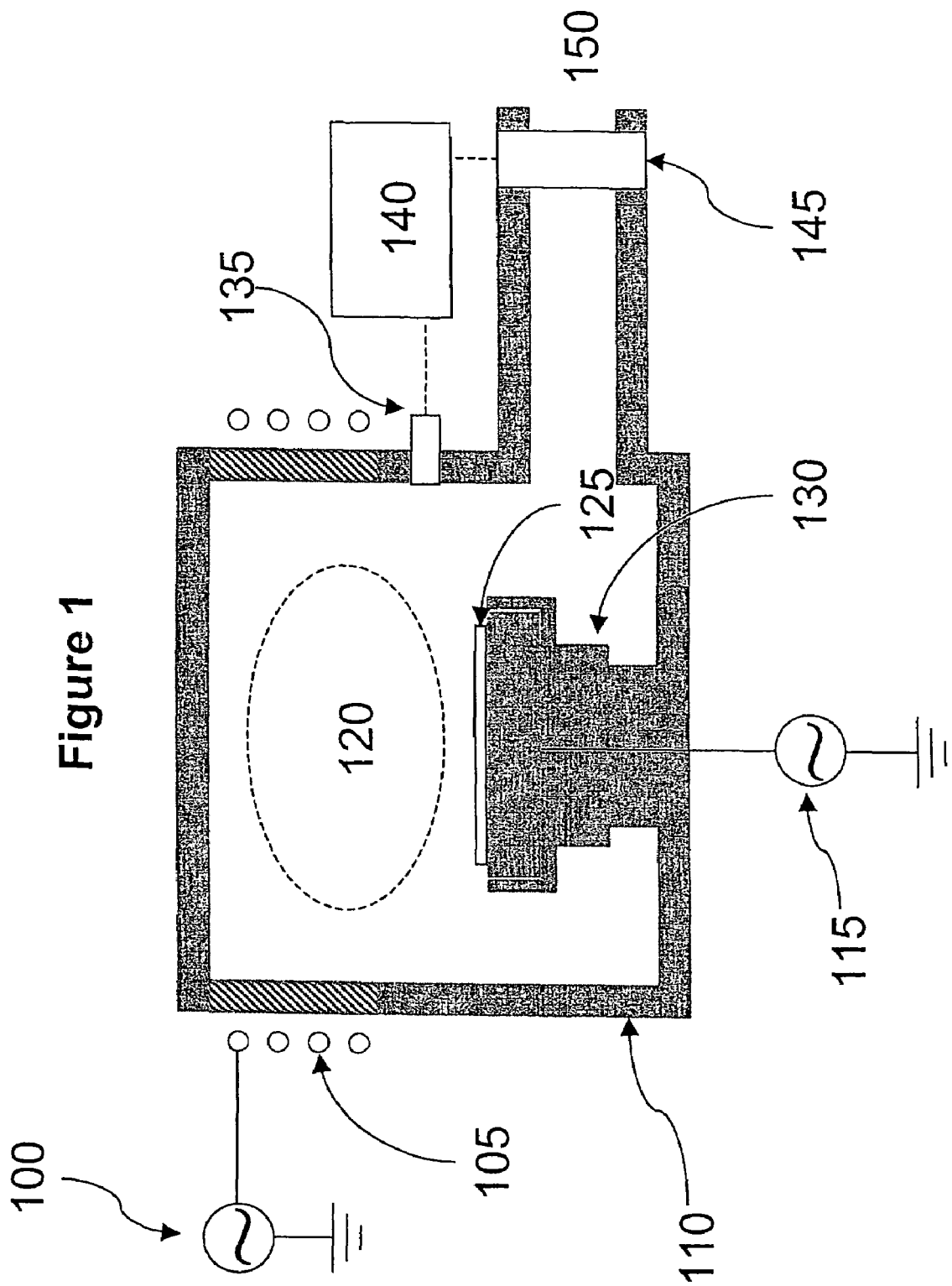
FIG. 1 is a side view showing the major assemblies of a plasma processing machine.

A plasma etching system according to the present invention is shown in FIG. 1. In an ICP reactor, a RF generator 100 delivers power to a coil 105 in the upper part of a reaction chamber 110. This power is transmitted into one or more process gases that are introduced through a gas inlet (not shown) in order to ionize the process gas or gases and form a plasma 120. A second RF generator 115 delivers power to a wafer support 130 so as to induce a DC bias on a wafer 125, thereby controlling the direction and energy of ion bombardment to the surface of the wafer 125. An evacuation system continuously removes the gaseous species (i.e., unreacted gases, volatile by-products, etc.) from the reaction chamber 110 through an exhaust manifold 150. The pressure in the reaction chamber 110 is regulated through a throttle valve 145. The throttle valve 145 is operated by a throttle valve controller 140. The reaction chamber 110 pressure is measured by a manometer 135. The output signal of the manometer 135 is fed as an input to the throttle valve controller 140.

Figure 2:
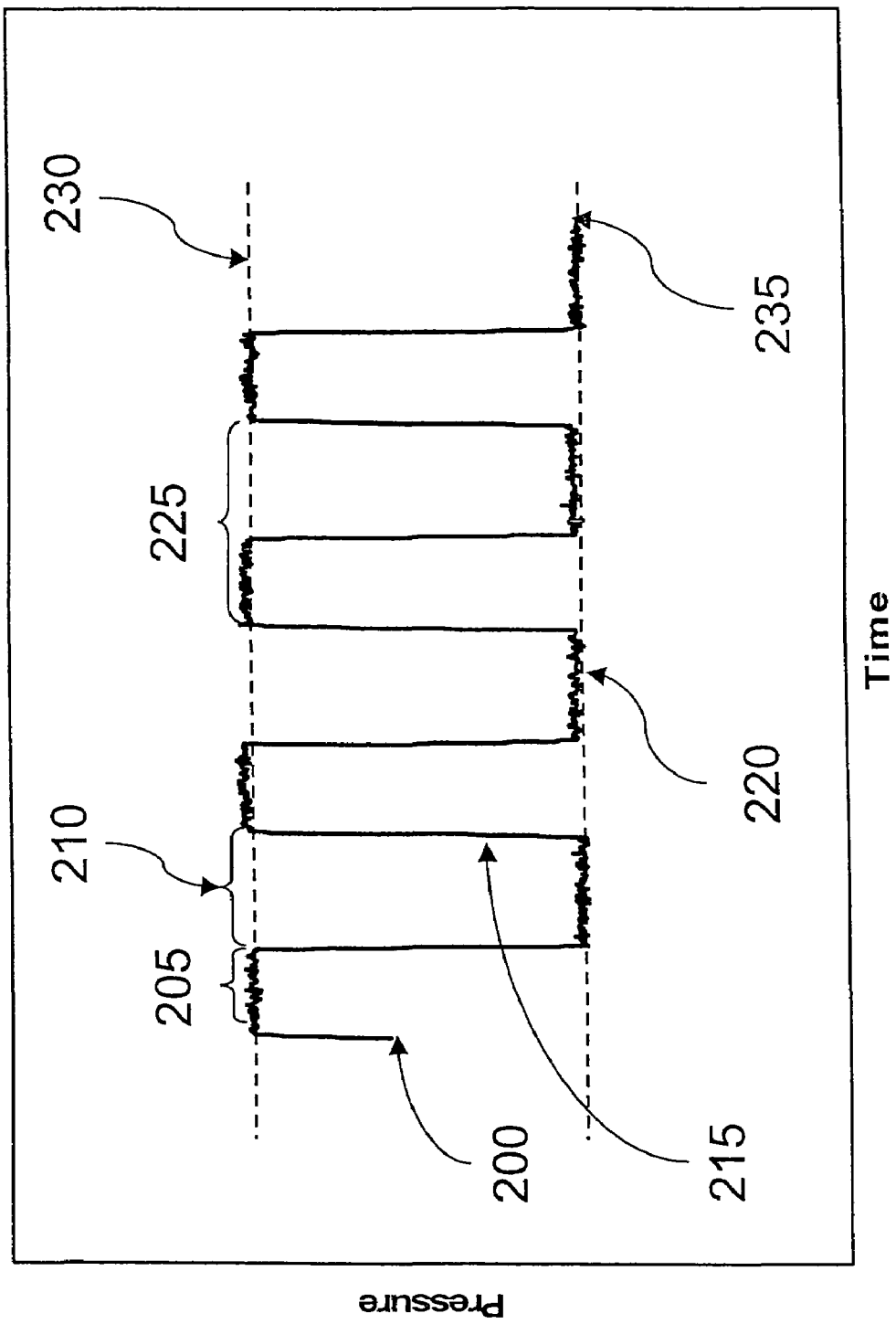
FIG. 2 is a graph of the desired pressure versus time response for a two step TDM process operated in pressure control mode.

FIG. 2 illustrates the desired pressure response 200 of multiple loops 225 for a two step TDM process. The pressure set point 230 for the first step 205 requires a different throttle valve position than the pressure set point 235 for the second step 210. A quick pressure response is desired in a TDM process due to the rapid rise time 215 between steps in conjunction with minimal deviation from set point 220 during the process steps.

Figure 3:
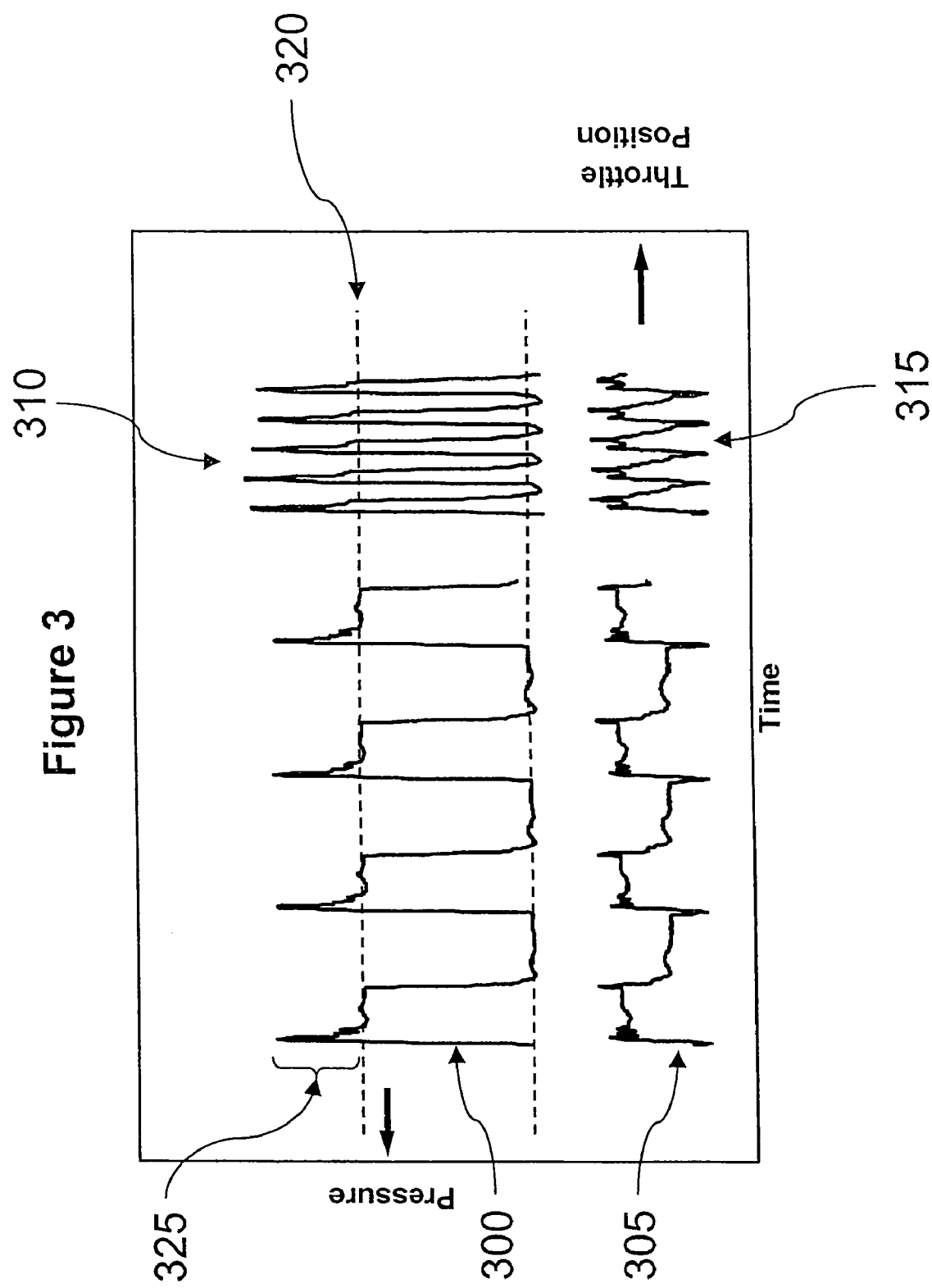
FIG. 3 is a graph of the prior art pressure versus time response for a two step TDM process operated in a pressure control mode.

FIG. 3 graphically illustrates a prior art solution with the throttle valve controller in pressure control mode. This figure shows a plot of pressure response 300 versus time with a corresponding throttle valve position 305 for a two step TDM process. During a TDM process, this control method results in pressure overshoot 325 from the recipe specified set point 320. The pressure control performance degrades further as the TDM step 310 duration decreases. In addition, the corresponding throttle valve position 315 never realizes a steady state position.

Figure 4:
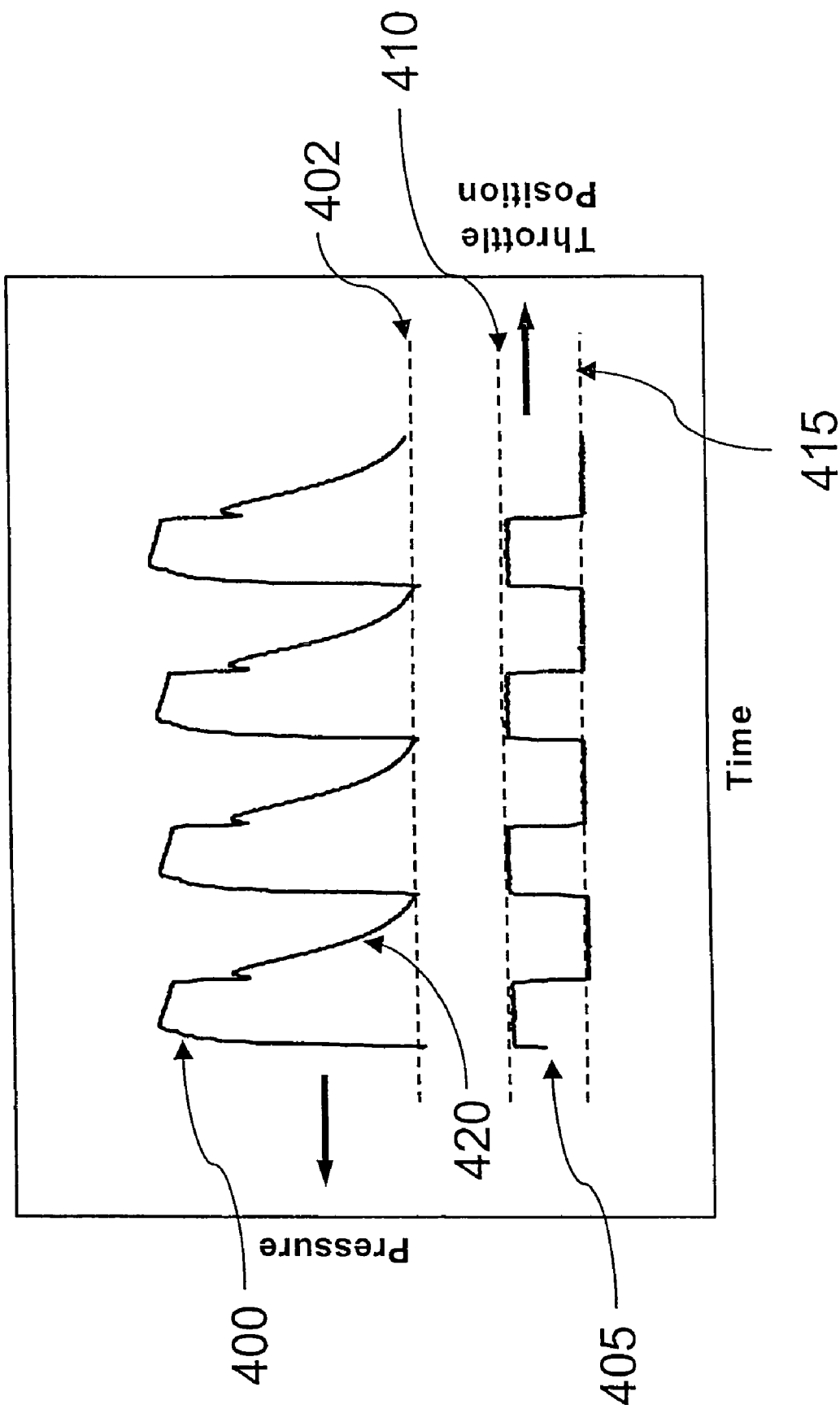
FIG. 4 is a graph of the prior art pressure versus time response for a TDM process operated in position control mode.

FIG. 4 graphically illustrates an alternative prior art solution with the throttle valve controller in position control mode. This figure shows a plot of pressure response 400 versus time with a corresponding throttle valve position 405 for a two step TDM process. This control method uses throttle valve position set points 410 & 415 to drive the throttle valve to set positions during the TDM process. In this example, a delay in pressure response 420 relative to position set point change is noticed and the desired pressure 402 is never achieved.

Figure 5:
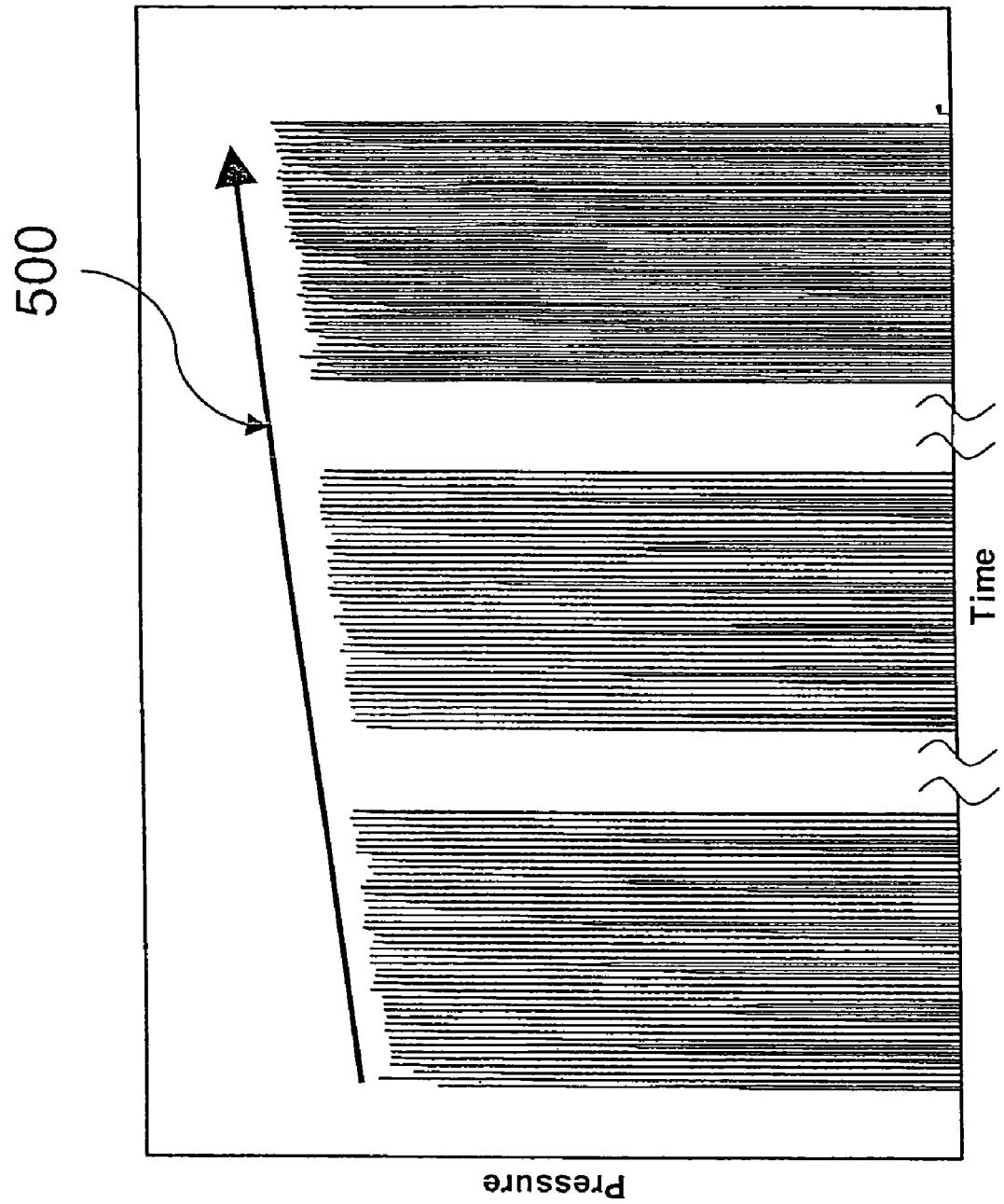
FIG. 5 is a graph of the prior art pressure versus time response for a TDM process operated in position control mode over longer time scales.

FIG. 5 graphically illustrates yet another problem encountered when position control mode is used to control reaction chamber pressure. This figure shows a plot of pressure response versus time for a two step TDM process with a fixed throttle valve position using two different gas flows in the corresponding steps. Pressure drift 500 over a long process run (100's of iterations) is observed. This pressure drift 500 may be due to the temperature increase in the reaction chamber wall. Consequently, additional measures must be taken in order to maintain process performance reliability and repeatability.

Figure 6:
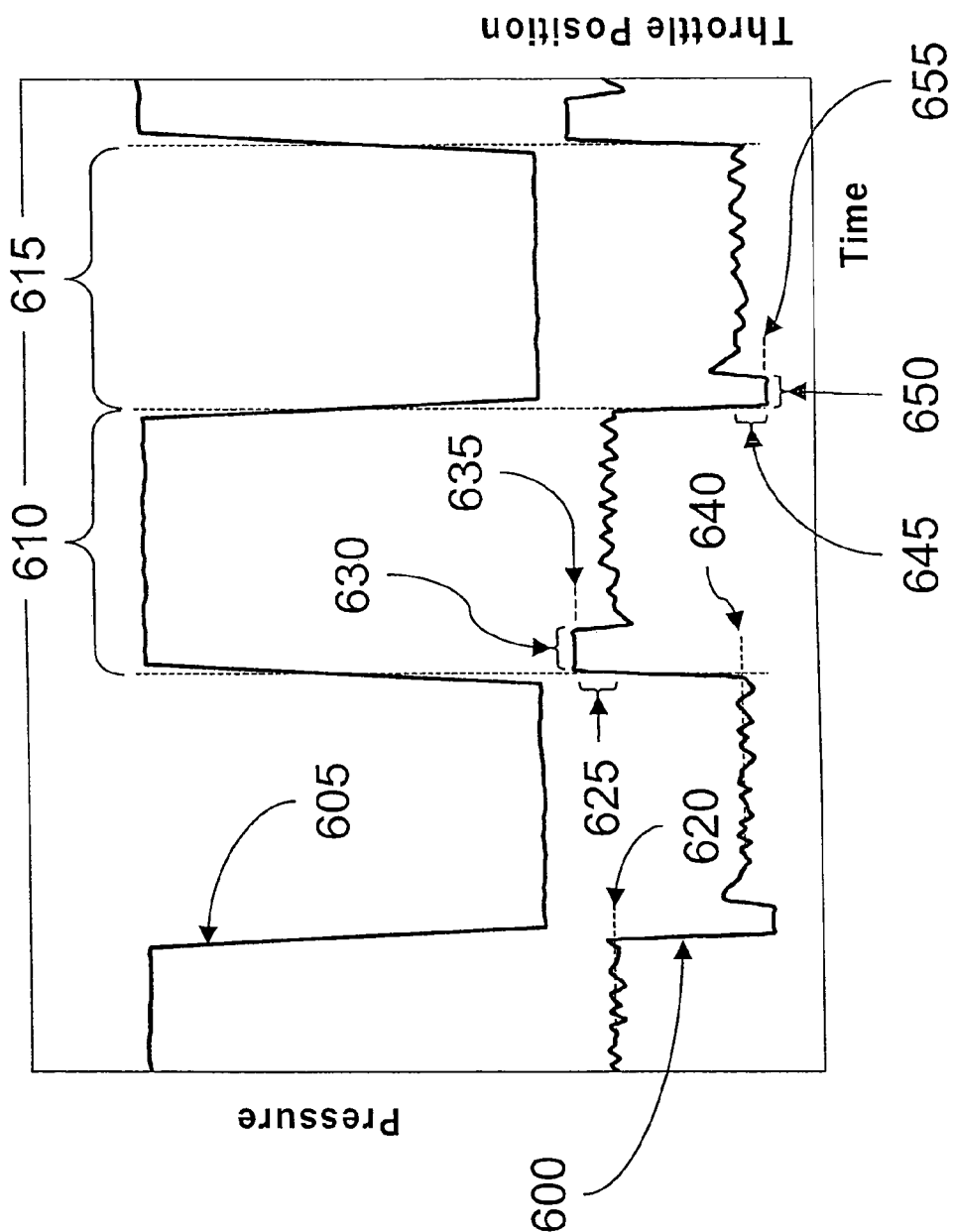
FIG. 6 is a graph explaining the control system of an embodiment of the present invention.

FIG. 6 shows a graph of a pressure response 605 versus time with a corresponding throttle valve position 600 for a two step TDM process. As demonstrated earlier, pressure control during the transition between process steps has proven to be difficult as pressure overshoot may occur. According to one embodiment of the present invention, position control mode is applied in the first segment 630 of a step 610. The throttle valve is pre-positioned and held at a set position 635 that is derived from the throttle valve position 620 from the previous execution of the step. After the first segment 630, the throttle valve is released from the position control mode. At that point a closed loop feed back control algorithm is enabled so that pressure control mode is applied for the remainder of the step 610.

After the step 610 is completed, the process step is switched to a next step 615. During the first segment 650 of this step 615 the throttle valve is switched to position mode. The throttle valve is held at another set position 655 that is derived from the known throttle valve position 640 of the previous execution of that step. Position control mode is applied for a set period 650 and the throttle valve is held at the set position 655 for this entire period. After the holding period 650 is expired, the throttle valve is released and a pressure control mode is applied for the remainder of the step 615 by enabling a closed loop pressure feedback control algorithm for the throttle valve. Alternatively, in the step described above, the throttle valve can be pre-positioned at a position that is derived from the average value of the throttle valve position measured in a number of previous steps of the same kind. This has the advantage of smoothing out step to step variations.

In many TDM processes, it is beneficial to assign different time lengths for the holding periods 630, 650 (see FIG. 6). It is also beneficial to adjust the pre-positions 635, 655 flexibly—not just taking the throttle valve's last position from the previous process steps. According to another embodiment of the invention, the holding periods in the deposition step and the etch step are independently determined, and the pre-position values for the throttle valve in the holding periods are independently adjusted. One method of deriving an adjusted value for the pre-positions 635, 655 is to apply a multiplier to the throttle valve's last position from the previous execution of that step. As shown in FIG. 6, this multiplier will result in an offset 625, 645 of the pre-position values 635, 655 from the previous step value position 620, 640. In this manner, the pre-positioned throttle valve position can be offset either greater than or less than the position from the previous step.

Figure 7B:
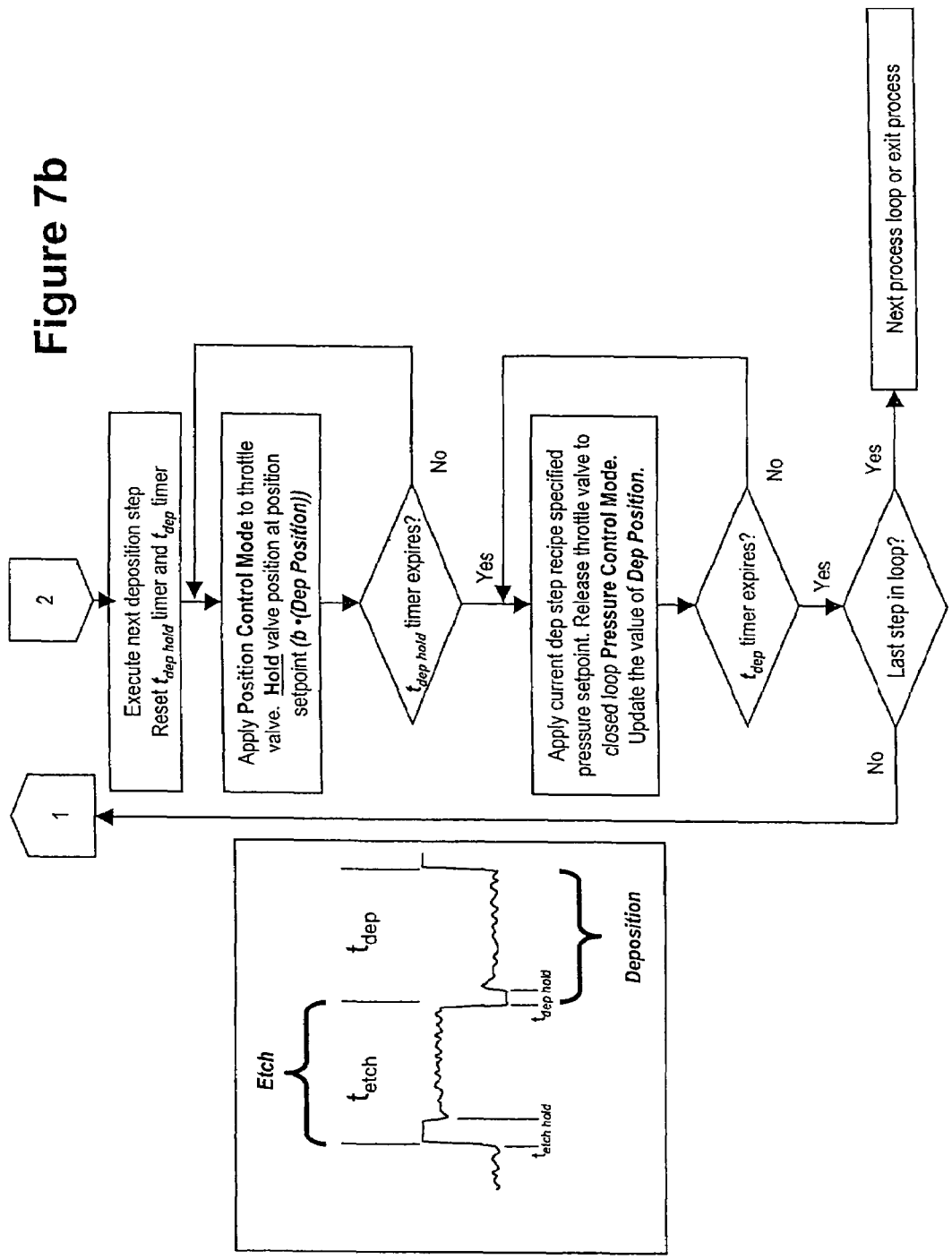
FIG. 7b is a continuation of the block diagram of FIG. 7a explaining the control system of an embodiment of the present invention.

A block diagram illustration for this embodiment is shown in FIGS. 7a and 7b for a two-step TDM silicon etch process. In FIG. 7a, the holding period is denoted as "$t_{etch\ hold}$" 630 and as "$t_{dep\ hold}$" 650. The step time periods are denoted as "$t_{etch}$" 610 and as "$t_{dep}$" 615. These time lengths can be part of the process recipe at the beginning of the execution of the process. Further more, the throttle valve position from the previous step is denoted as "Etch Position" 620 and as "Dep Position" 640. The pre-position for holding the throttle valve in the etch period 630 is taken from a preceding etch step and adjusted by a factor of α. Likewise, the pre-position for holding the throttle valve in the deposition period 650 is taken from a preceding deposition step and adjusted by a factor of β. The values of α and β can be set manually in the process recipe or automatically by a feedback control loop (e.g., PID) that measures the pressure and uses that information to adjust the pre-position value to minimize overshoot and minimize the time to reach setpoint as the process proceeds. The parameters α and β typically have a value between 0.5 and 2.0 which translate to 50 percent to 200 percent of the prior position. For example, in the case where α and β are set to 1.0, the invention will use the throttle valve position value 620 from the previous execution of the etch step as the pre-position value during the etch hold period.

It will be obvious to one skilled in the art that the pressure control scheme need not be applied to all steps within a TDM process loop. Setting the values of the etch hold length period 630 to zero allows the method to revert to the prior art method of closed loop pressure feedback control. Similarly, in the case where α and β are set to unity and the length of the etch hold period 630 is set to the etch step time 610 allowing the method to revert to the prior art method of position control mode (open loop pressure control mode).

PRESSURE CONTROL EXAMPLES

For any step in a TDM process using the current invention, two parameters need to be specified for the throttle valve; i.e., the duration of the hold time, and the magnitude of the offset.

FIG. 8 graphically exhibits experimental examples when the process control method of the present invention is implemented. The effect of various length of etch holding periods are displayed. As can be seen, if the etch holding period is less than about 0.1 seconds long, the pressure overshoot occurs during the deposition-to-etch transition. If the holding period is about 0.2 to 0.3 seconds long the overshoot is nearly eliminated and the deviation from the pressure set point 805 is minimized. As the etch holding time gets longer, the pressure overshoot reappears in the scope of the experiment. This result demonstrates that the hold and release method of the present invention indeed improves pressure control capability significantly.

In another embodiment of the invention, the pre-position hold time can be automatically adjusted as the process proceeds to minimize set point overshoot. FIG. 9 graphs the pressure set point overshoot versus the pre-position hold time from the data of FIG. 8 for a two step TDM silicon etch process. A feedback control loop (e.g., PID) that measures the pressure overshoot uses that information to adjust the pre-position hold time to minimize overshoot as the process proceeds. Likewise a feedback control loop (e.g., PID) that measures the time to reach setpoint can use that information to adjust the pre-position hold time so that the time to reach setpoint is minimized as the process proceeds.

FIG. 10 graphically exhibits experimental examples when the process control method of the present invention is implemented. The effect of various values of pre-positioning offsets for a fixed duration are displayed. At a negative 5% etch hold position adjust ($\alpha$=0.95) the pressure overshoot is minimized. This result demonstrates that the hold and release method of the present invention indeed improves pressure control capability significantly.

It will be apparent to one skilled in the art that the described embodiments can be applied to multi-step looping processes that contain two or more process steps per loop. The invention can also be applied to looped processes where the pressure set-point or other recipe specified step parameters are changed within a loop during the course of the process, (e.g., morphed TDM processes).

It is important to note that the invention does not require a hold time and position offset for each step type within the alternating process. Another embodiment of the invention would include introducing a position hold time for at least one of the step types within a TDM process.

Figure 11:
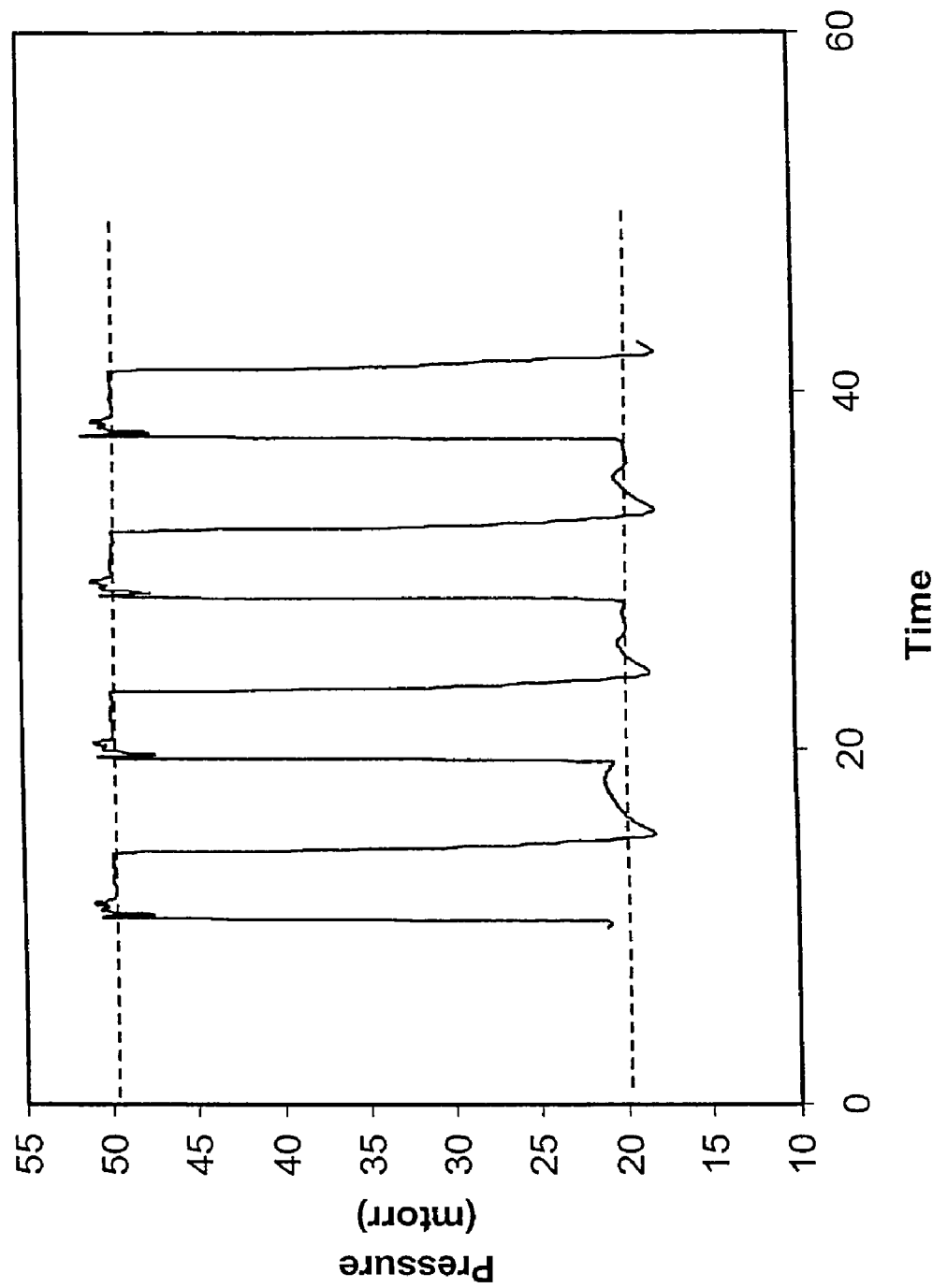
FIG. 11 is a graph of pressure versus time for experimental examples when the process control method of the present invention is implemented where etch hold times are held at 0.25 seconds and deposition hold times are held at 0.40 seconds with a constant position offset for the etch step of $\alpha$=0.88 and a constant position offset for the deposition step of $\beta$=1.25.

FIG. 11 graphically presents an example in which optimized control of pressure in a two step TDM silicon etch process is attempted. In FIG. 11, "$t_{etch\ hold}$" is 0.25 seconds, "$t_{dep\ hold}$" is 0.4 seconds, $\alpha$=0.88 and $\beta$=1.25. Compared with previous examples (see FIGS. 3, 4 and 5), the resultant pressure profile during the cyclical TDM process operation is significantly improved as it is nearly "squared". The pressure approaches the set point values more rapidly and pressure overshoot and undershoot are almost eliminated.

Figure 12:
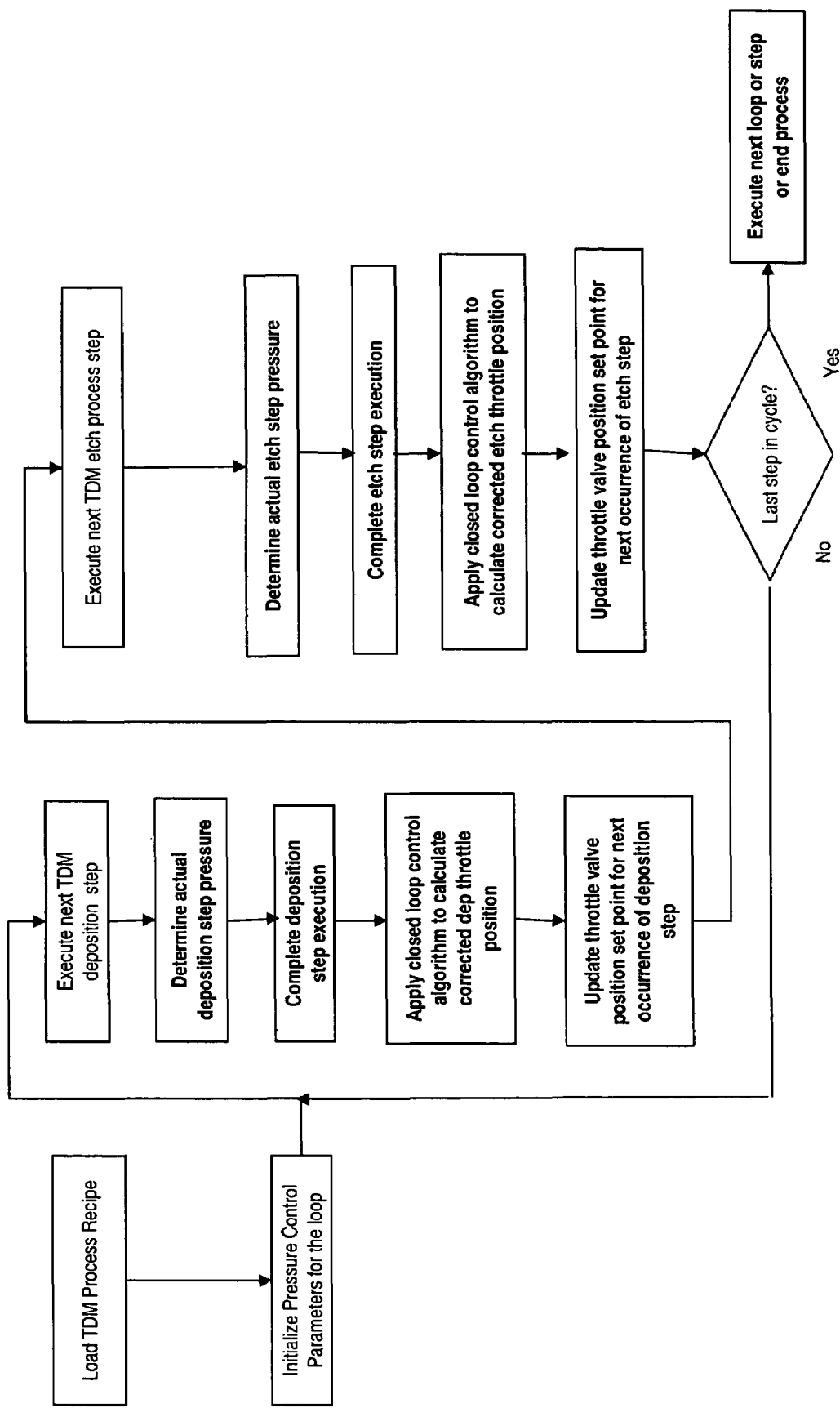
FIG. 12 is a block diagram explaining the control system of another embodiment of the present invention.

FIG. 12 shows a block diagram illustration of yet another embodiment of the invention. This embodiment addresses the short coming of throttle valve position control through the application of a closed loop pressure control algorithm from step-to-step while maintaining throttle valve position control (open loop pressure control) within a TDM step. The embodiment is described below as applied to a two step TDM process. The method may also be applied to TDM processes that have more than two steps within a loop. Similarly, the method can be applied to any subset of steps within a TDM process.

Once the TDM process parameters have been loaded, initial values must be determined to achieve the desired process pressure set point. These initial values can be determined in a number of ways (e.g., offline calibration experiments prior to running the process, or performing the first few (or one) loop of the TDM process using the throttle valve in closed loop pressure control and using that value as a starting point for subsequent steps).

For the example two step TDM case, once the throttle valve value has been initialized, the process executes the first step within the loop (e.g., a deposition step). During the execution of this step, the throttle valve is set to position mode and directed to move to the initialized position. The valve is held at this position for the remainder of the step.

During the step, the pressure that corresponds to the position set point is recorded and compared to the process requested pressure set point. This information is then processed by a closed loop control algorithm (e.g., PID, feed forward, etc.) which results in an improved throttle valve position for the next occurrence of that step type within the loop.

The example above illustrates the throttle valve being held at a constant value (position) within a step. The throttle position within a step may be varied during the course of the step as a function of step time. This function can be non-linear.

The recorded step pressure that corresponds to a position set point input may be determined in a number of ways (e.g., derived from all or some subset of pressure readings from the step). In particular, it is useful to use a sample subset near the end of the step as these values can be more indicative of the steady state pressure for that step. These values can be smoothed or filtered within a step or over loop iterations (step-to-step) to improve the control of the closed loop algorithm.

Figure 13:
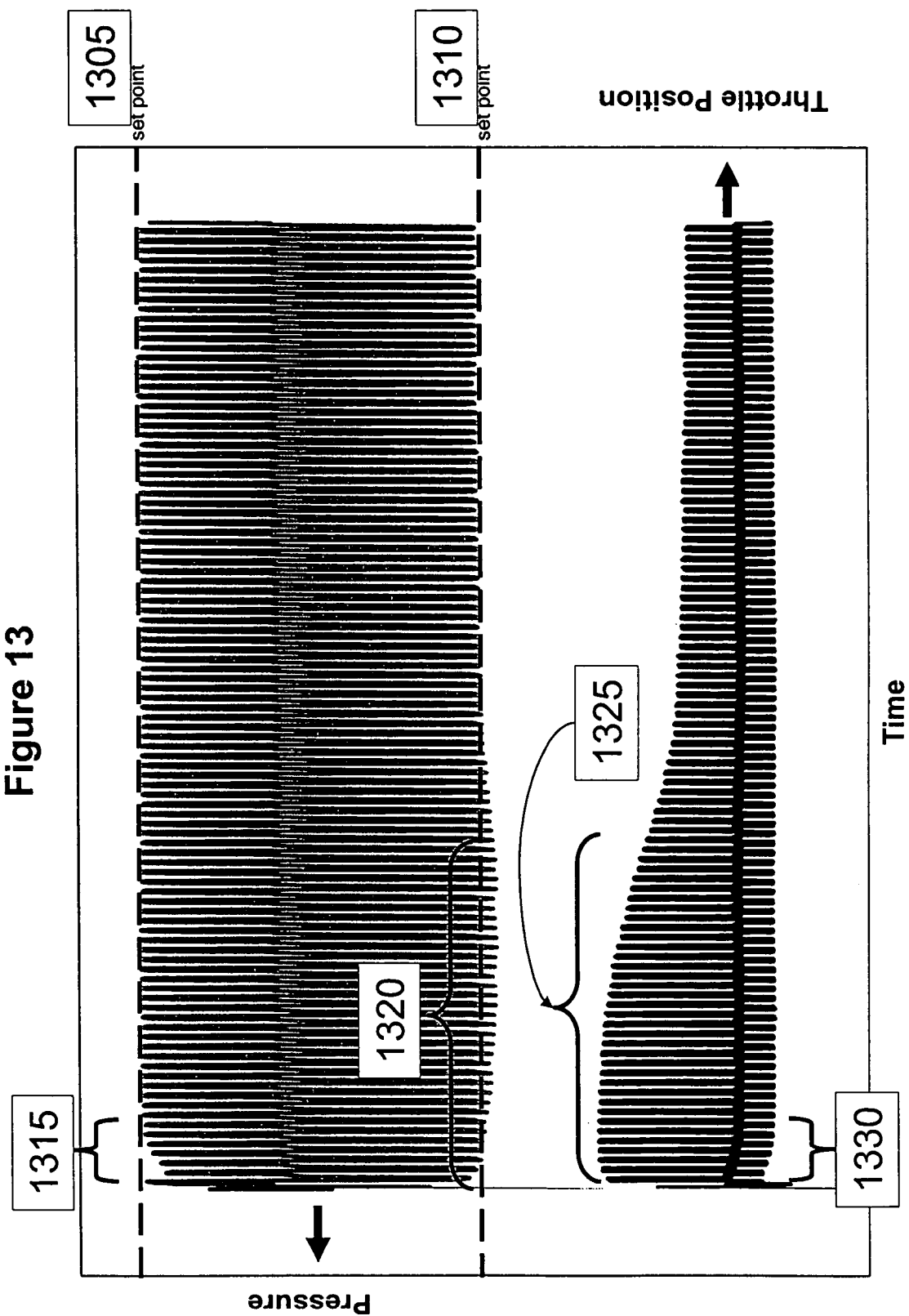
FIG. 13 is a graph of pressure versus time for experimental examples when the process control method of the present invention is implemented for various input values.

FIG. 13 graphically exhibits an experimental example when the step-to-step pressure control method is implemented. The TDM process consisted of three steps, including an etch step with an associated pressure set point 1305, and a deposition step with a different pressure set point 1310. The early region of the etch pressure response 1315 shows the actual pressure is less than the pressure set point 1305. A closed loop feed back control algorithm (e.g., PID, etc.) was used to adjust the etch throttle position 1330 step-to-step to eliminate the etch pressure offset. Similarly, the early region 1320 of the deposition pressure response shows the actual pressure is less than the process specified set point. A second closed loop feedback control algorithm (e.g., PID) was used to adjust the deposition throttle position 1325 step-to-step to eliminate the deposition pressure offset. In this example, the throttle position for at least one step was adjusted from loop-to-loop by holding the throttle position constant for a step within a loop. In another embodiment of the invention, the throttle position can be varied within a loop in a predetermined manner, sampled at some point within the step, and a closed loop control algorithm applied to the throttle position from loop to loop.

Figure 14:
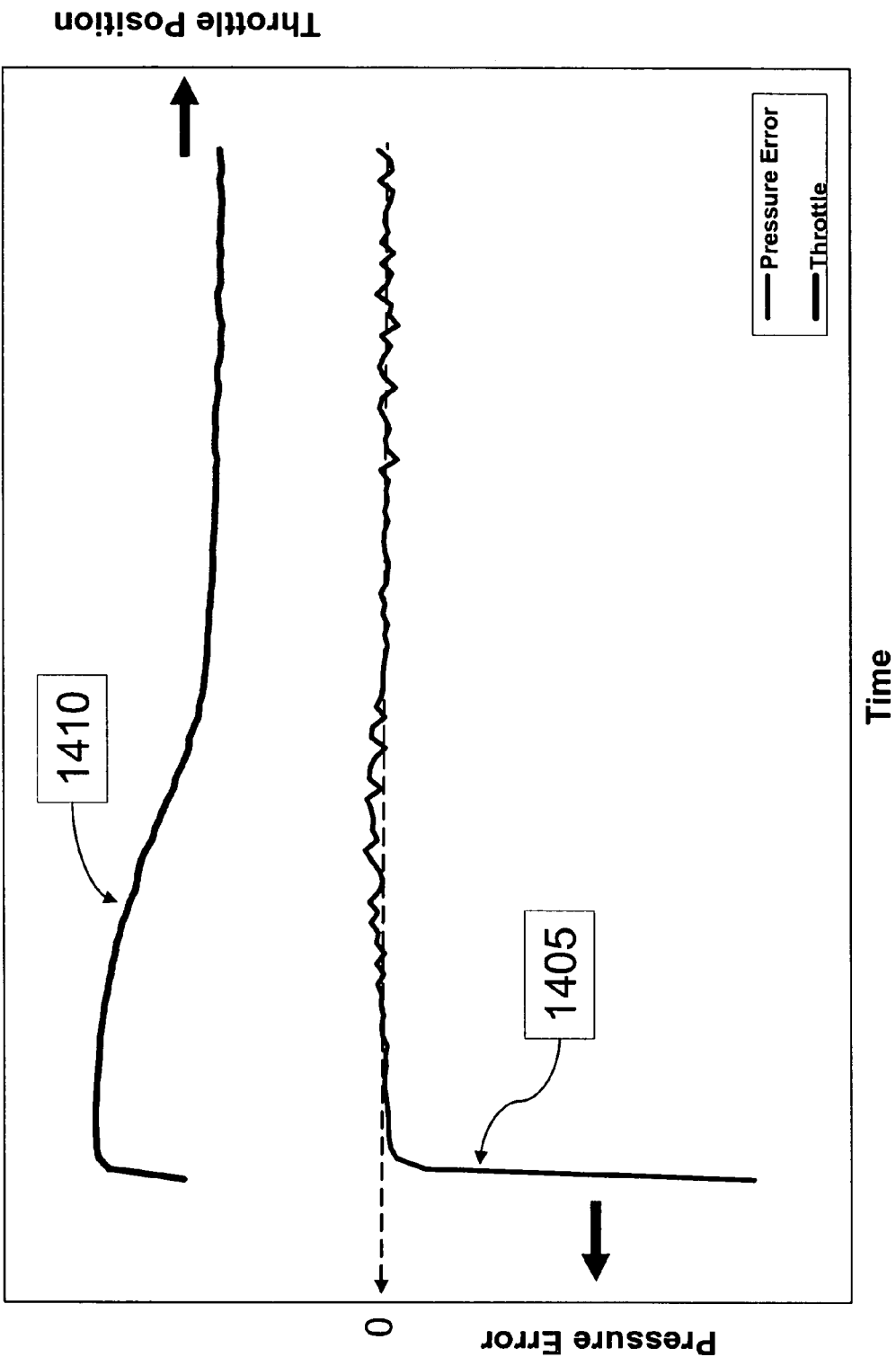
FIG. 14 is a graph of pressure versus time re-plotting the data of FIG. 13.

FIG. 14 re-plots the data from FIG. 13 for the deposition step of the TDM silicon etch process from loop to loop. The lower curve 1405 shows the pressure error as a function of loop number. The pressure error in this case was the difference between the actual pressure recorded at the end of the deposition step and the recipe specified pressure set point. The throttle valve position 1410 is controlled by a feed back loop in response to the value of the pressure error function 1405. In this example, the recipe specified set point for the deposition step was held constant from loop to loop. It is known in the art to change the pressure set point from loop to loop to maintain profile control. Changing the pressure set point from loop-to-loop for a particular step will induce an error signal for that step which in turn will be corrected by the closed loop controller.

Figure 15:
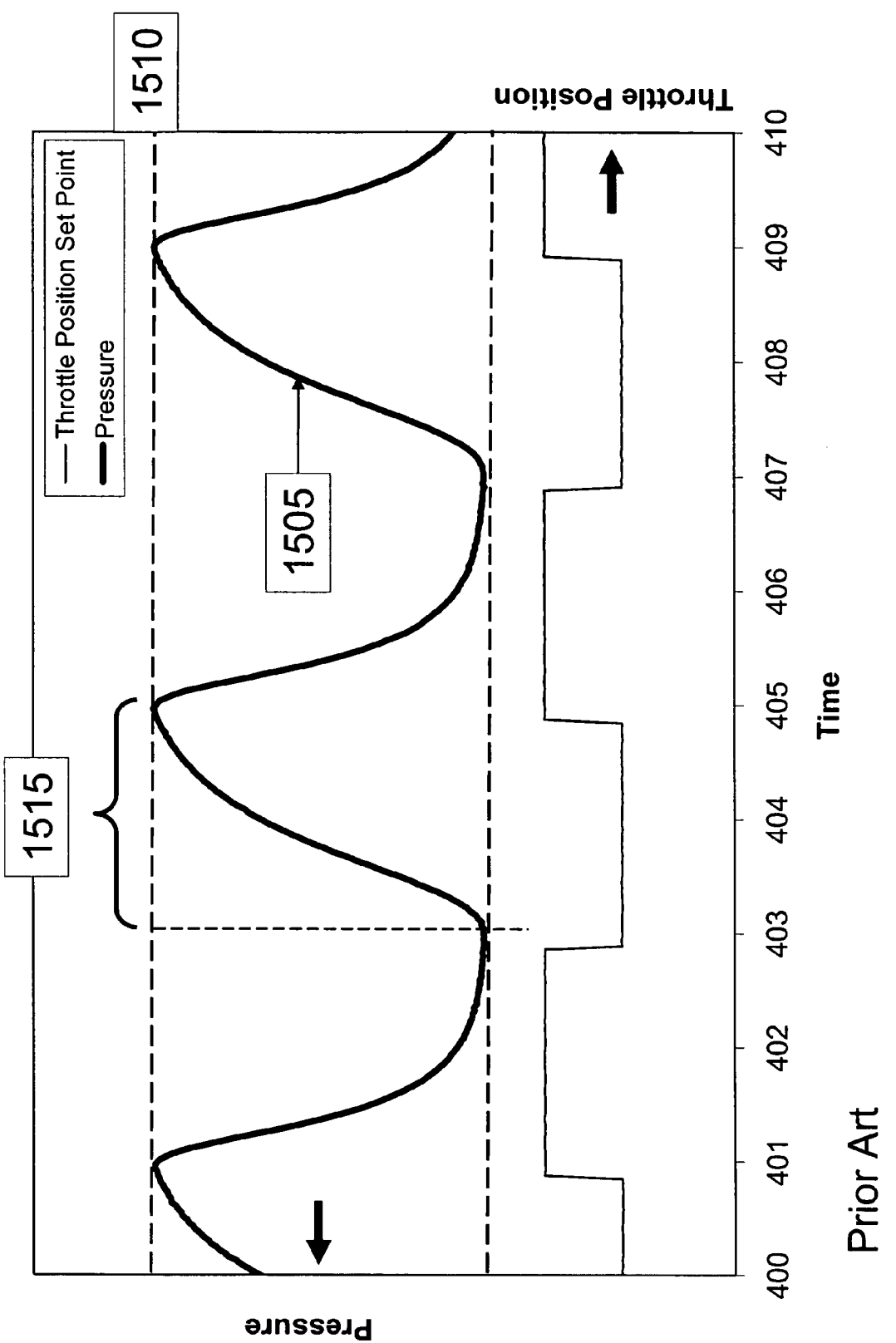
FIG. 15 is a graph of the prior art pressure versus time response for a TDM process operated in throttle valve position control mode.

FIG. 15 shows a plot of the prior art method of throttle valve position control for a two step TDM process (similar to FIG. 4). While the position control method may be used to prevent the pressure response 1505 from exceeding the pressure set point 1510, there is a significant period of time 1515 where the pressure response 1505 is significantly different from the recipe specified set point 1510.

Figure 16A:
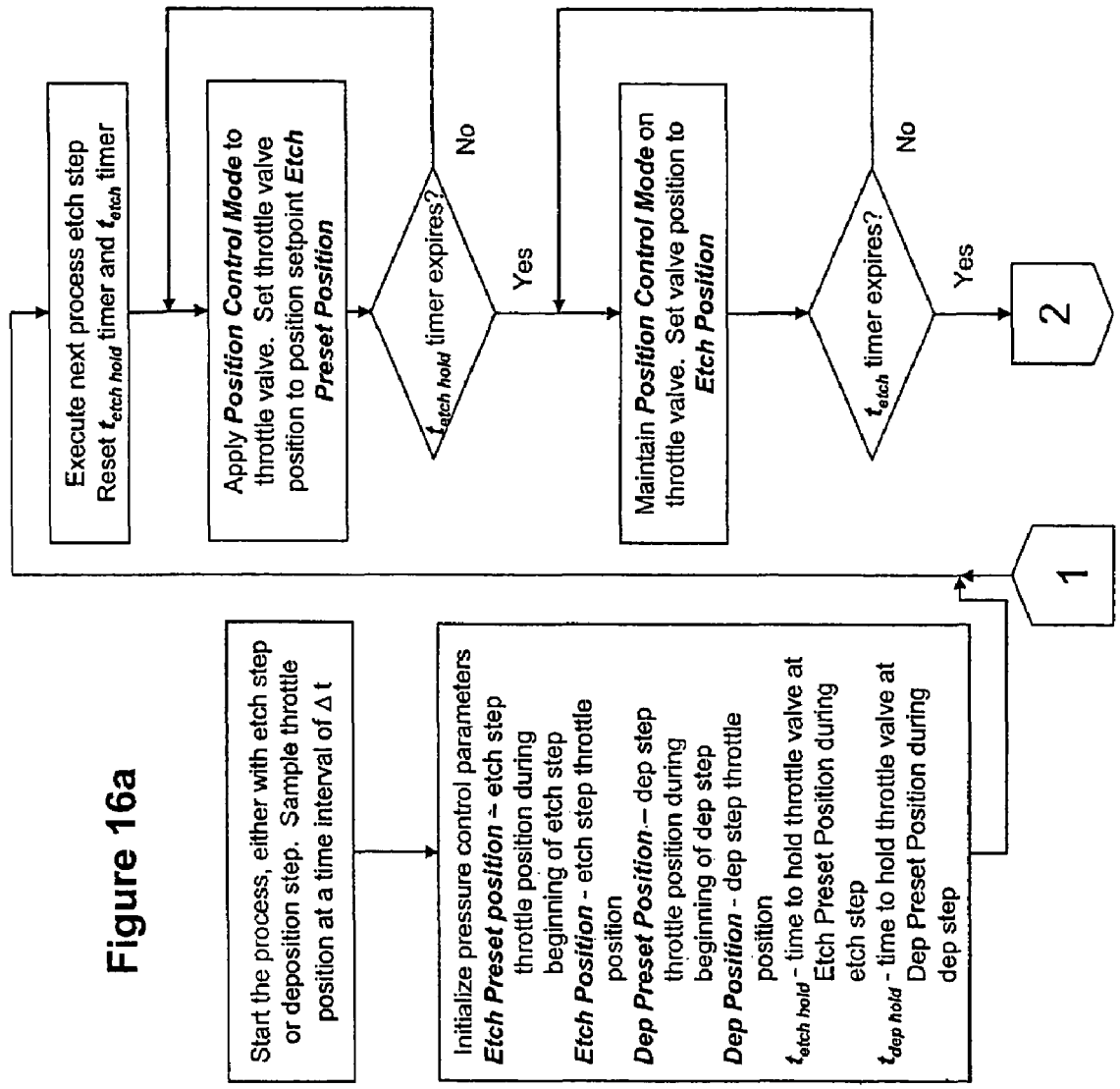
FIG. 16a is a block diagram explaining the control system of another embodiment of the present invention.
Figure 16B:
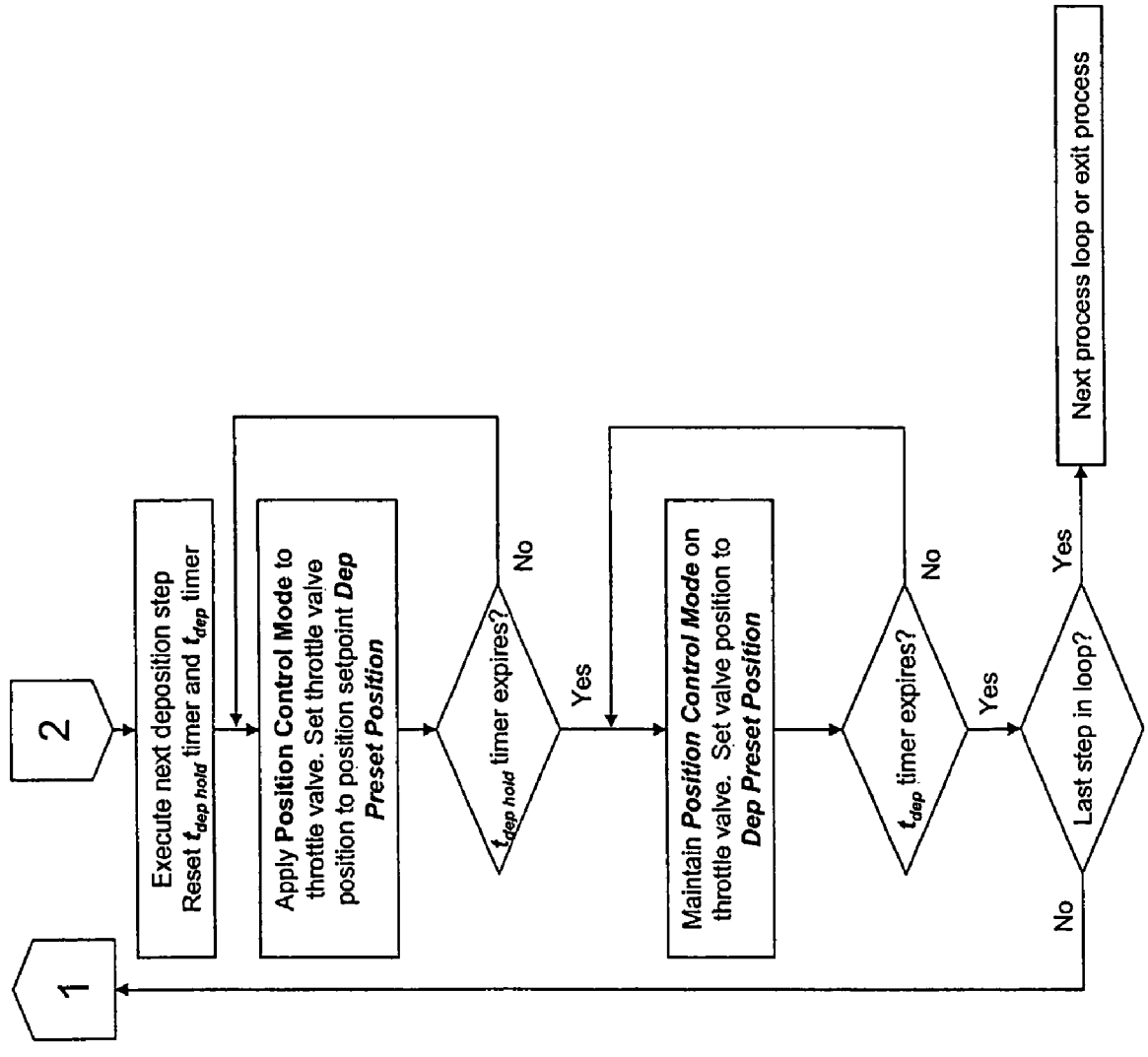
FIG. 16b is a continuation of the block diagram of FIG. 16a explaining the control system of another embodiment of the present invention.

FIG. 16 is a block diagram of yet another embodiment of the current invention. This method overcomes the shortcomings of the prior art shown in FIG. 15. The block diagram illustrates the invention as applied to a two step TDM silicon etch process. Note that the same method can be applied to a TDM process with two or more steps. In addition, the method may be applied to any subset of steps within a TDM process.

Figure 17:
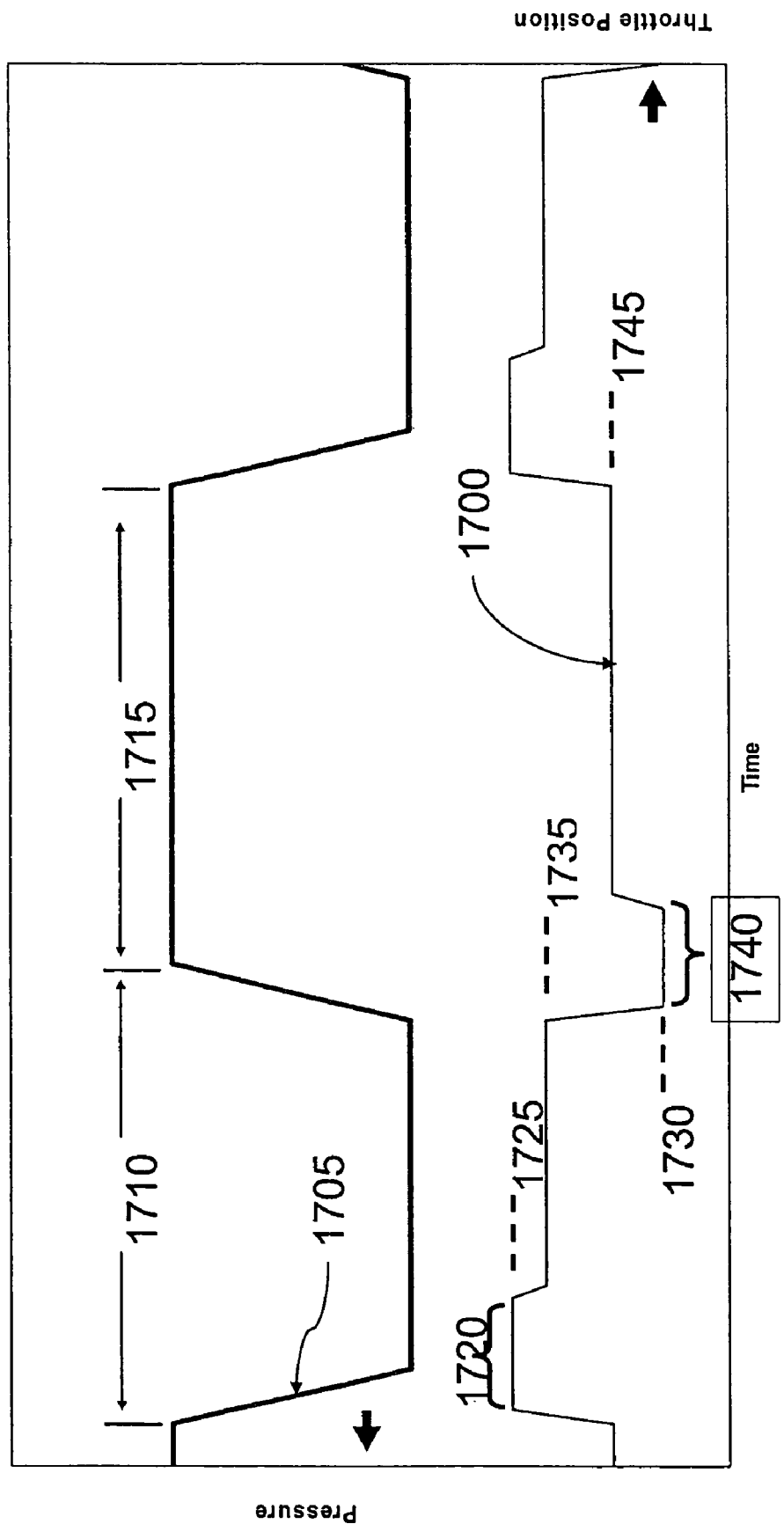
FIG. 17 is a graph of pressure versus time illustrating the process control method of the present invention as shown in FIGS. 16a and 16b is implemented for various input values.

FIG. 17 is a graphical representation of the method of FIG. 16. The method makes the transition between two different set points shorter by over driving the input variable at the beginning of the transition. In the case of pressure control, the throttle valve position is the input variable that is driven past the recipe specified set point for a period of time, before being released to the recipe specified value in order to optimize the pressure response 1705.

For pressure control of a two step TDM silicon etch process consisting of a deposition step 1710 and an etch step 1715, the method requires an etch preset throttle valve position 1730, an etch preset hold time 1740, an etch throttle valve position 1745, a deposition preset throttle valve position 1725 a deposition preset hold time 1720, and a deposition throttle valve position 1735. The etch preset throttle valve position 1730 is the throttle position during the beginning of the etch step 1715. The etch preset hold time 1740 is the length of time from the beginning of the etch step to hold the etch preset throttle valve position 1730. The etch throttle valve position 1745 is the throttle position that corresponds to the recipe specified pressure or throttle position for the etch step.

Similarly, the deposition preset throttle valve position 1725 is the throttle position during the beginning of the deposition step 1710. The deposition preset hold time 1720 is the length of time from the beginning of the deposition step 1710 to hold the deposition preset throttle valve position 1725. The deposition throttle valve position 1735 is the throttle position that corresponds to the recipe specified pressure or throttle position for the deposition step.

At the beginning of the etch step 1715 of a TDM process, the throttle valve is set to the etch preset position 1730. This position is held until the etch preset hold time 1740 expires. The throttle position is then moved to the etch throttle position 1745. Similarly, at the beginning of a deposition step 1710 of a TDM process, the throttle valve is set to the deposition preset position 1725. This position is held until the deposition preset hold time 1720 expires. The throttle position is then moved to the deposition throttle position 1735. Note, instead of maintaining the throttle position at a constant position during the hold duration, the valve position may be varied in a predetermined manner as a function of time.

In order to shorten the duration of the pressure response 1705 to a set point transition, the throttle position preset values are chosen to "overshoot" the set point position. For example, if the throttle position of the previous step is less than the throttle position corresponding to the current step's throttle position or pressure set point, the preset throttle position for the current step will be greater than the throttle position set point for the current step. Similarly, if the throttle position of the previous step is greater than the throttle position corresponding to the current step's throttle position or pressure set point, the preset throttle position for the current step will be less than the throttle position set point for the current step.

The preset throttle positions (both deposition and etch) can be determined by a number of methods, including characterization experiments prior to running the TDM process, or through the use of a closed loop feed back algorithm that adjusts the preset throttle position value during the process. The preset throttle position may also be derived from the recipe specified position (e.g., applying a multiplier and/or offset to the recipe specified throttle position).

In the example above, the preset position is held constant for the time period of the position preset hold time. In another embodiment of the invention, the preset position can vary during the preset hold time (e.g., preset position is a function of time, monotonically increase or decrease, etc).

The preset hold times can also be determined by a number of methods, including characterization experiments prior to running the TDM process, or through the use of a closed loop feed back algorithm that adjusts the preset time value during the process.

Figure 18:
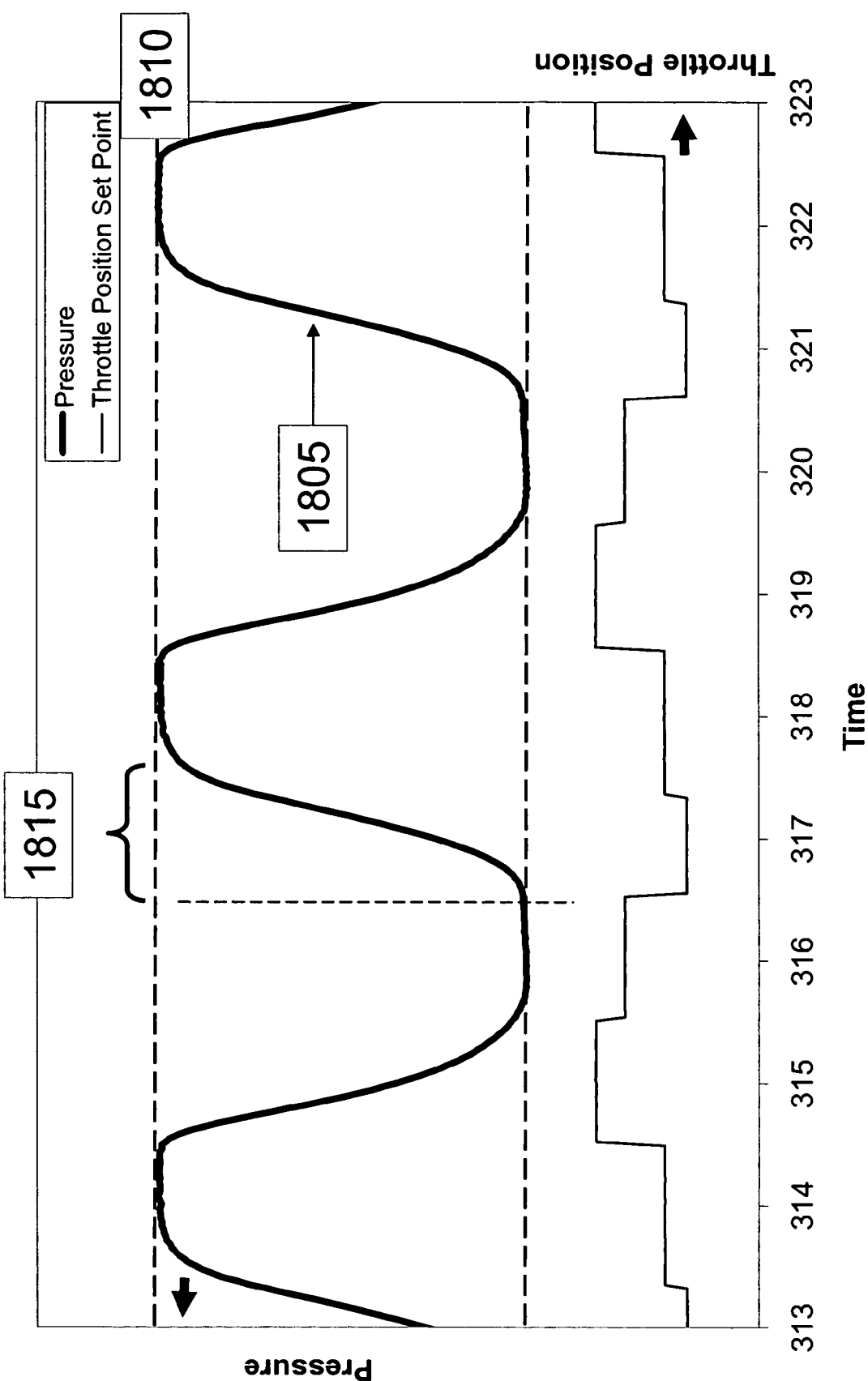
FIG. 18 is a graph of pressure versus time for experimental examples when the process control method of the present invention as shown in FIGS. 16a and 16b is implemented for various input values.

FIG. 18 shows an example of the method from FIG. 17 applied to a two step TDM silicon etch process. Note, the duration of the transition 1815 for the pressure response 1805 to reach set point 1810 is significantly shorter than the prior art method of position control (compare the duration 1515 in FIG. 15 to the duration 1815 in FIG. 18). The process parameters for FIGS. 15 & 18 were identical. The process was a two step TDM silicon etch process.

|  |  | Deposition | Etch |
| --- | --- | --- | --- |
| $SF_6$ | sccm | <5 | 635 |
| $C_4F_8$ | sccm | 150 | <5 |
| Pressure | mtorr | 30 | 80 |
| Time | seconds | 2 | 2 |

The pressure control parameters for the data in FIG. 18 are shown below:

|  |  | Deposition | Etch |
| --- | --- | --- | --- |
| Throttle Hold Position | % | 20% | 20% |
| Hold Time | ms | 1000 | 800 |

The throttle hold position for the data shown in FIG. 18 was derived from the recipe specified set point for that step. In both the deposition and etch steps, the throttle hold position was set for a 20% overshoot of the recipe specified throttle position set point.

Figure 19:
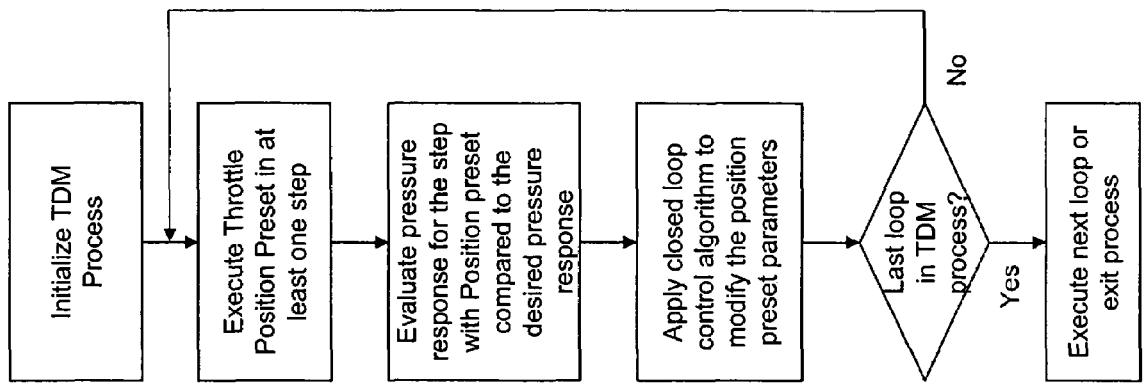
FIG. 19 is a block diagram explaining the control system of another embodiment of the present invention.

In yet another embodiment of the current invention, the pressure control parameters (throttle valve hold position and throttle valve hold time) can be optimized as the process is executed through the use of a closed loop control algorithm. FIG. 19 shows a block diagram outlining this method for a TDM process containing at least one process step that utilizes a throttle valve preset to improve pressure control. The method requires initial values for the throttle valve hold position and throttle valve hold time. These values may be determined from previous experiments or process history. As the process proceeds, the pressure response is compared to the recipe specified set point generating an error value.

This error value is input to the closed loop controller which outputs an improved throttle hold position and or throttle hold time.

In another embodiment of the invention, the initial throttle valve hold position is held constant throughout the process. This simplifies the control architecture by allowing the closed loop controller to adjust only one variable, the position hold time, to optimize the pressure overshoot response.

Similarly, in another embodiment, the throttle hold time is held constant throughout the TDM process. This allows the closed loop controller to adjust only one variable, the throttle valve hold position, to optimize the pressure overshoot response.

It is important to note that if more than one TDM process step utilizes the method, each step may have its own closed loop control algorithms. Furthermore, if multiple closed loop control algorithms are used, each step may have a different algorithm.

Figure 20:
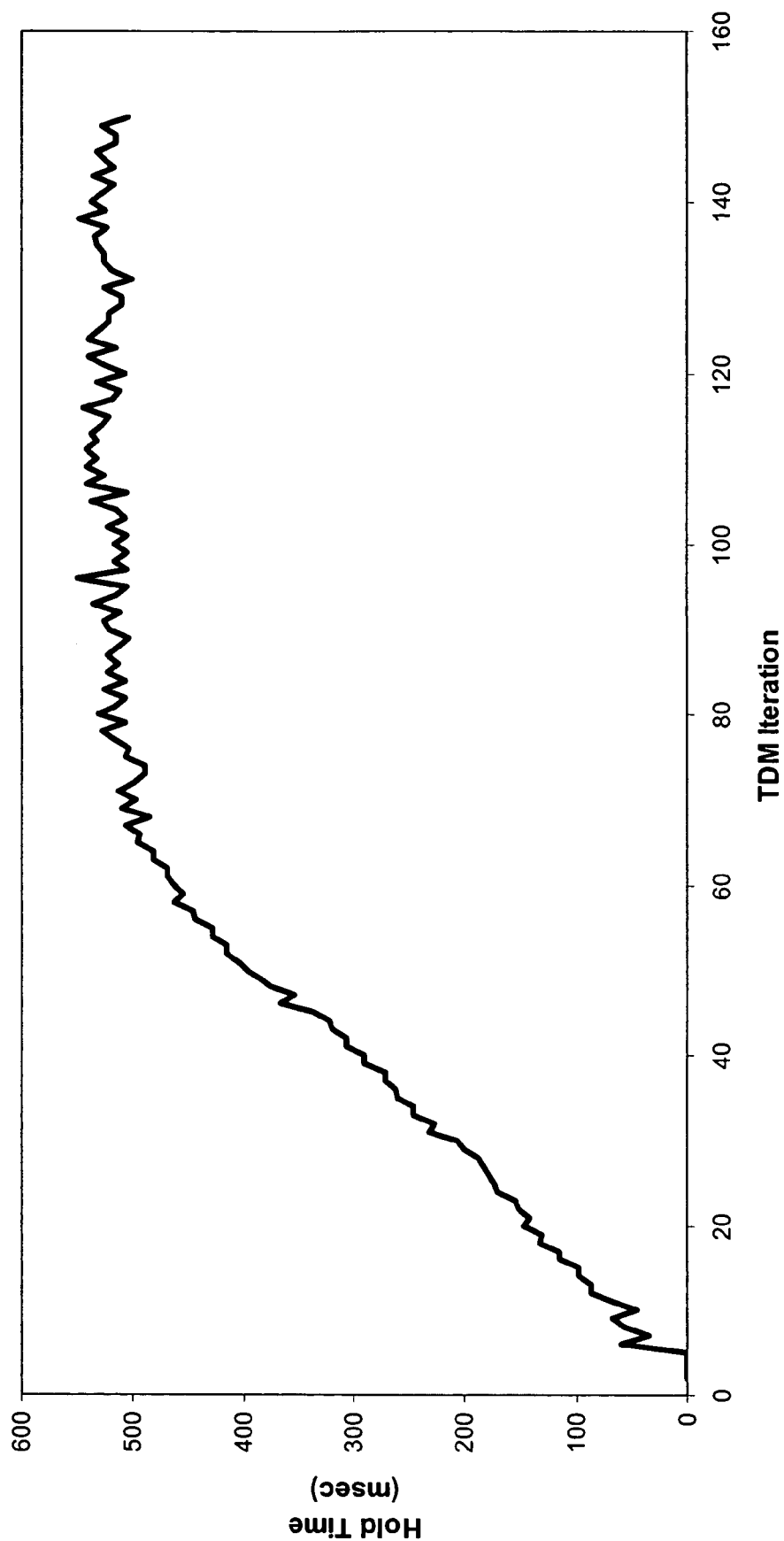
FIG. 20 is a graph of hold time versus TDM iteration for experimental examples when the process control method of the present invention as shown in FIG. 19 is implemented for various input values.

FIG. 20 is a graphical representation of experimental data from the method shown in FIG. 19. In this experiment, a two step TDM silicon etch process was used. The parameters for the etch process are shown below:

|  |  | Deposition | Etch |
| --- | --- | --- | --- |
| $SF_6$ | sccm | <5 | 635 |
| $C_4F_8$ | sccm | 150 | <5 |
| Pressure | mtorr | 30 | 80 |
| Time | seconds | 2 | 2 |

In these experiments, the hold time value was adjusted by the control algorithm on a step to step basis. FIG. 20 shows the applied deposition hold time as a function of TDM iteration. Initially, a zero value hold time was applied to the deposition step in order to illustrate the method. The throttle hold position was derived from the recipe specified throttle position in the step and set to overshoot the throttle set point by 12%. The graph shows the Deposition Hold time reaching a steady state value of 520 ms within 65 TDM loops (iterations).

The initial value for the hold time in a step can be set a number of ways, including values derived from off-line experiments or previous processes. The initial value can also be determined during the first few cycles by maintaining the throttle hold position until the actual pressure reaches the pressure set point, recording the corresponding time and using that hold time for the next occurrence.

The experimental data in FIG. 20 was generated by applying a throttle hold position derived from the position or pressure set point and controlling the shape of the pressure response by varying the throttle valve hold time at that position. Similarly control algorithms could be used that use a recipe derived hold time or correct both throttle position hold time and hold position using a closed loop control algorithm.

Figure 21:
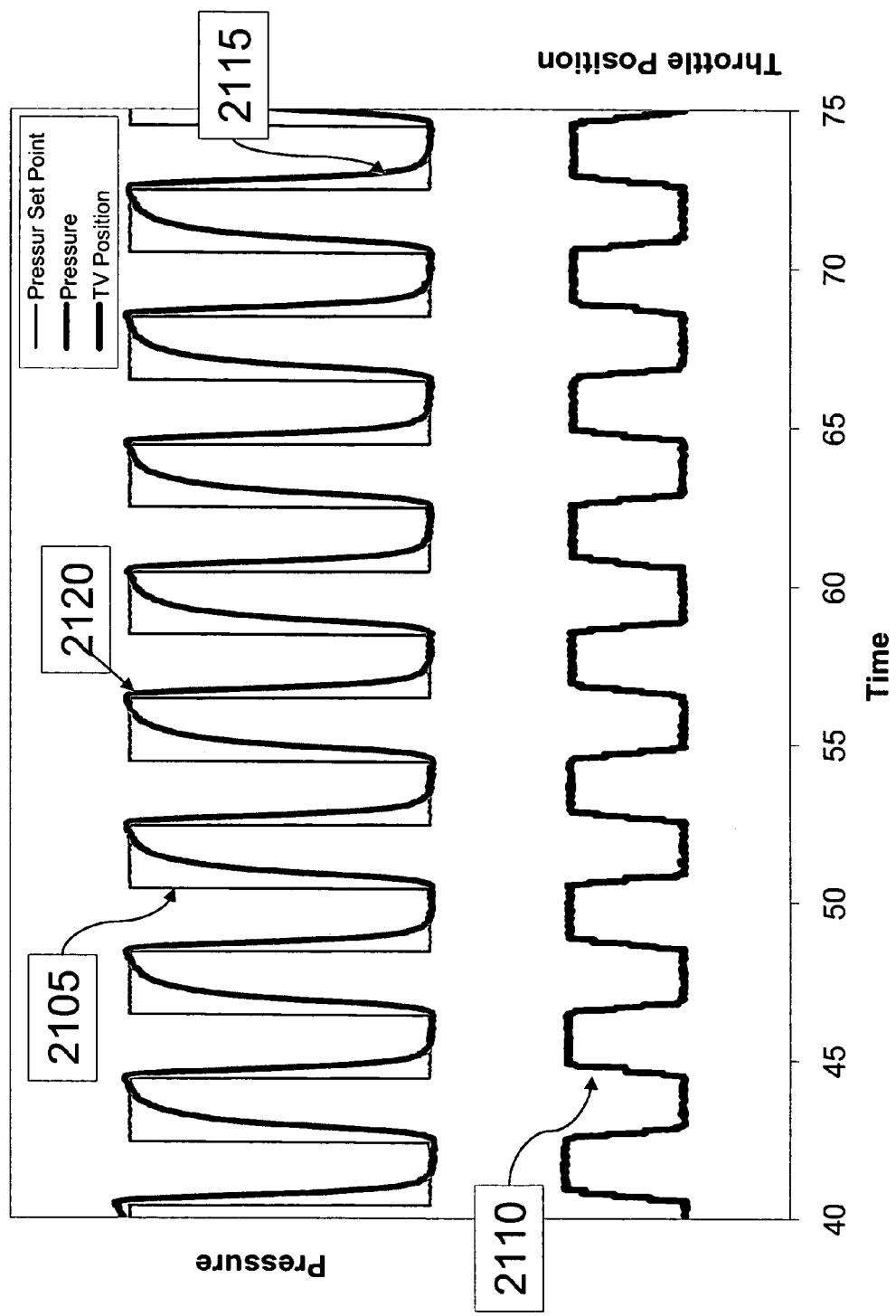
FIG. 21 is a graph of pressure versus time for the data in FIG. 20.

FIG. 21 shows the pressure set point 2105, throttle valve position 2110, and pressure response 2115 corresponding to the data in FIG. 20. Due to the initial hold time of 0 msec, reducing to pure position control mode the pressure response 2115 reaches the pressure set point 2105 at the end of the step 2120.

Figure 22:
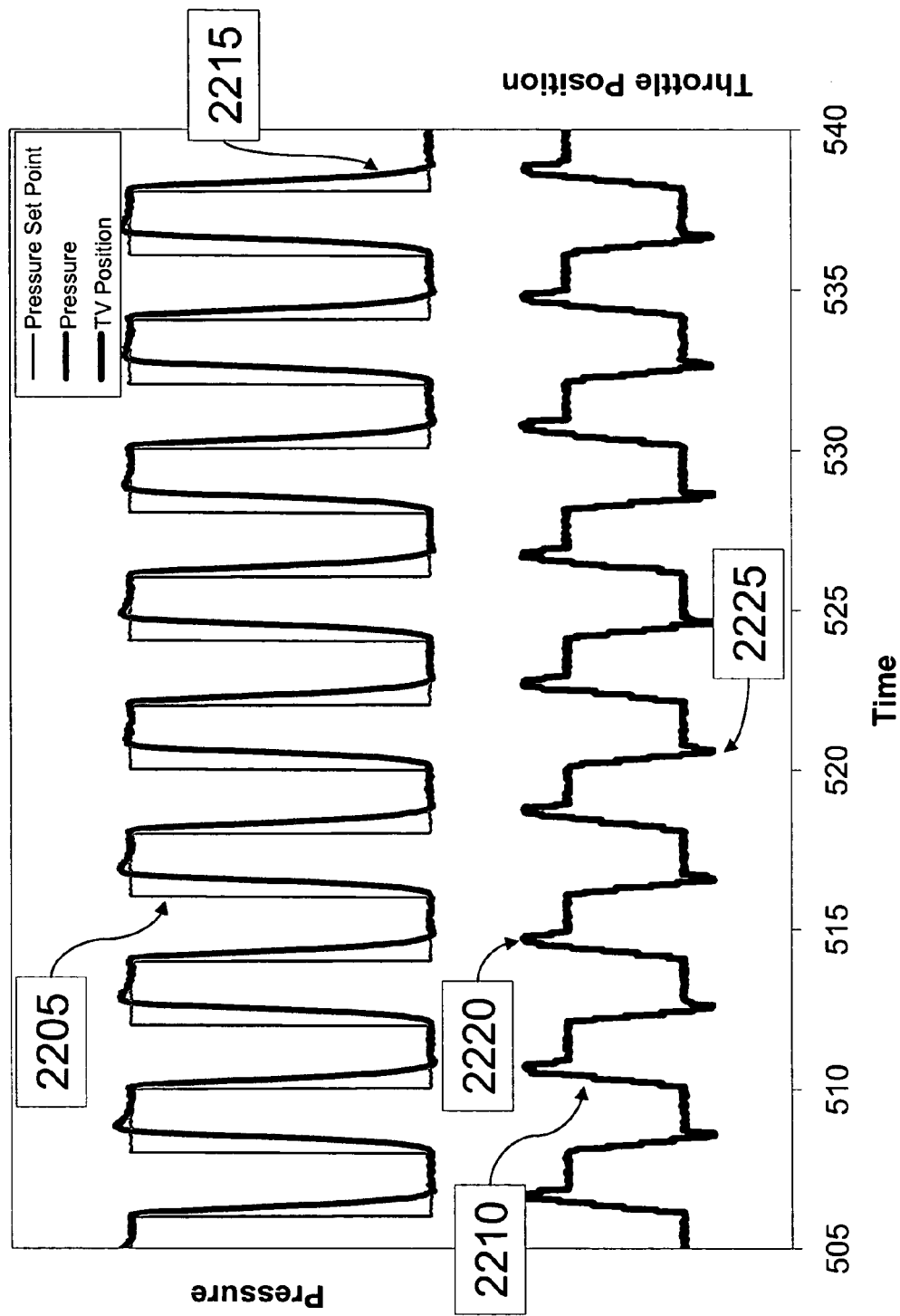
FIG. 22 is a graph of pressure versus time for the data in FIG. 20 at a later time than the data in FIG. 21.

FIG. 22 shows the pressure response for the same process shown in FIG. 21 at a later time. At this point the control algorithm has determined stable values for both the deposition 2220 and etch 2225 throttle position hold times. The pressure response 2215 more closely follows the pressure set point 2205 (compare to pressure set point 2105 and pressure response 2115 in FIG. 21).

Note, the method of FIG. 12 may be combined with the method of FIGS. 16 and 19 to obtain a pressure control algorithm that results in closed loop pressure control step-to-step, open loop pressure control within a step, with a second control loop that decreases the time for the pressure response to reach the set point while minimizing pressure overshoot.

Figure 23:
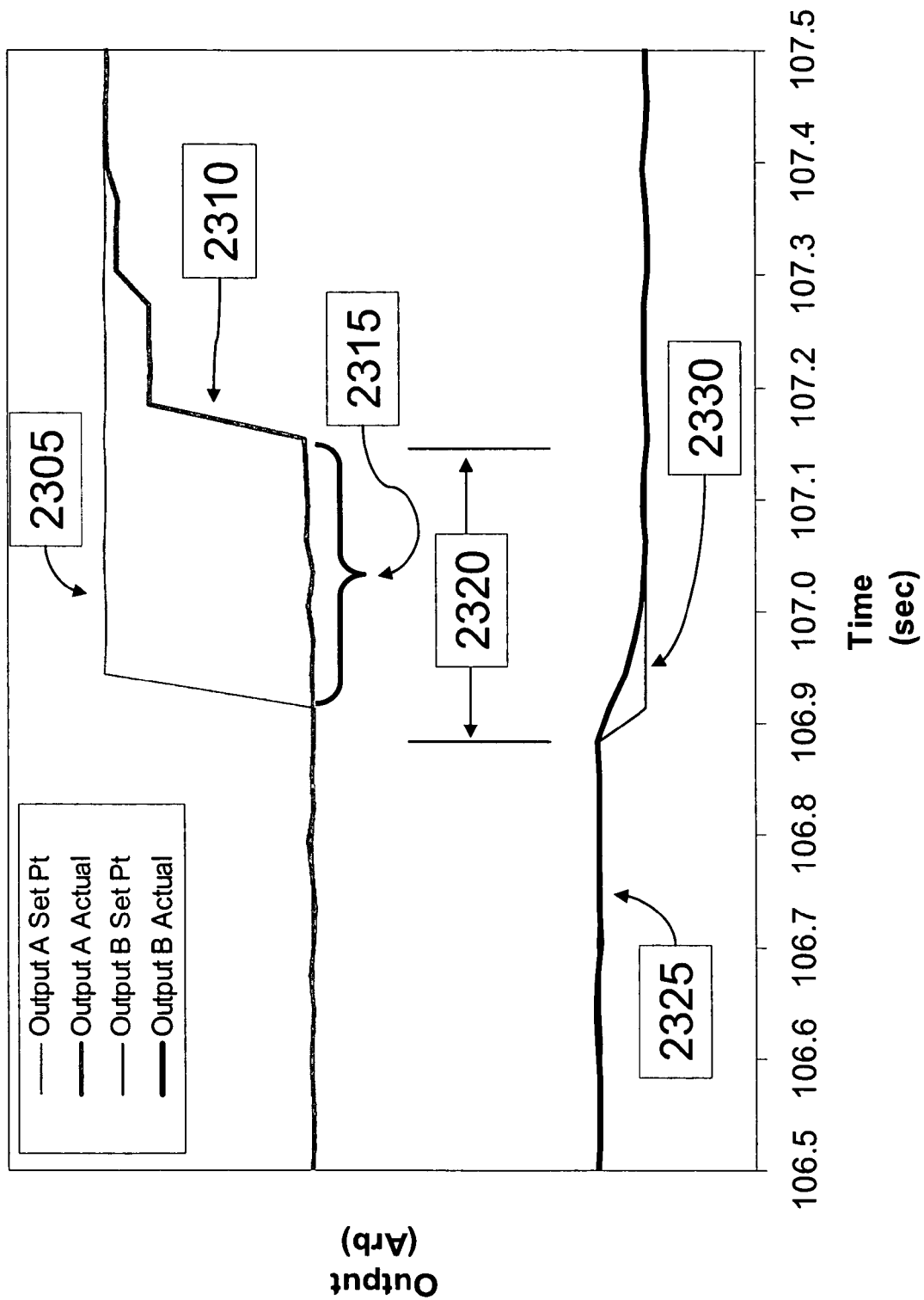
FIG. 23 shows the set point and output responses for two different variables at a step transition for a two step TDM process.

TDM processes consist of a series of process loops and steps. It is common for at least one recipe parameter set point to change from step-to-step. Typically during the transition from one step to the next, all set point changes are executed simultaneously at the beginning of the new step. Due to variable response times of the process outputs, the output responses will not be synchronized. As the timing of a TDM process is reduced, synchronization errors that were only a small fraction of the total step time become significant. These errors can arise from timing offsets incurred in passing the set points or timing errors introduced at the component level through the introduction of a dead time between when the set point information is received and the output responds. FIG. 23 shows the set point and output responses for two different parameters at a step transition for a two step TDM process. While the output B response 2325 responds immediately after a set point change 2330, the output of response A 2310 shows a significant dead time 2315 following a change in the set point 2305. This results in a synchronization error 2320 between the output response of A and B.

Figure 24:
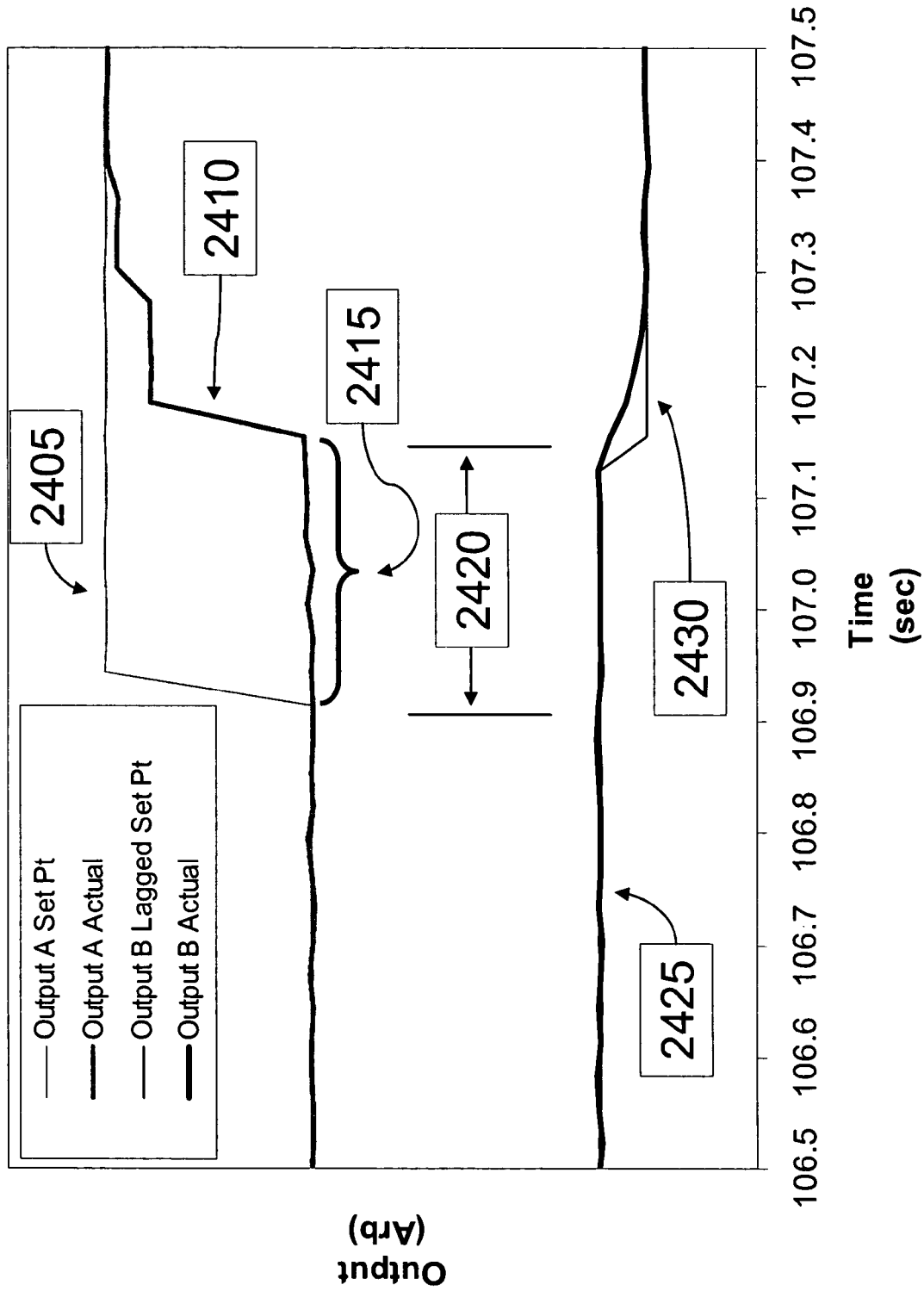
FIG. 24 shows an example where the set point change has been delayed in relation to the change in set point in order to synchronize the output response.

Once the lag 2315 has been characterized, it is possible to correct it by applying a timing modification to (lagging) the set point of the leading response in order to resynchronize the output responses. FIG. 24 shows an example where the set point change for output B 2430 has been delayed for duration 2420 in relation to the change in set point A 2405 in order to synchronize the output B response 2425 with the output A response 2410. Conversely, it is also possible to correct the lag 2315 by leading the set point of the lagging response.

The timing modification can be applied to any subset of the recipe parameters that undergo a set point change during a step transition. Note that the timing of each recipe parameter can be modified either independently, or as a function of the timing modification of another parameter.

Note, in some cases it may be desirable to purposefully introduce a non-synchronization between the output responses. For example, when two recipe parameters have significantly different output response times, it can be beneficial to delay the set point change of the parameter with the faster response.

It is also important to note that for a TDM process that the set point changes that occur during the transition from one step to the next need not be simultaneous. In another embodiment, the method shown in FIG. 23 can be used to maintain or modify the timing relationship between recipe parameters from step to step in a TDM process that contains recipe parameter set points that do not execute simultaneously at a step transition. In another embodiment, the system can monitor the timing performance of at least two recipe parameters (e.g., pressure, gas flow, RF power, etc.) and adjust the synchronization using a closed loop control algorithm during the TDM process.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method of controlling pressure in a chamber during an etch process, the method comprising:
   placing a substrate in the chamber;
   executing a time division multiplexed etch process within the chamber;
   positioning a throttle valve based on an open-loop pressure control algorithm within at least one step of said time division multiplexed etch process;
   positioning said throttle valve based on a closed-loop pressure control algorithm from step-to-step of said time division multiplexed etch process; and
   removing said substrate from the chamber.

2. The method of claim 1 wherein said time division multiplexed etch process further comprising:
   depositing a passivation layer on said substrate by means of a plasma;
   etching a material from said substrate by means of a plasma; and
   performing a process loop of repeating the deposition step and the etch step.

3. The method of claim 1 wherein said open-loop pressure control algorithm is a throttle valve position control.

4. The method of claim 3 wherein said throttle valve is held in a constant position by said throttle valve position control within a step of said time division multiplexed etch process.

5. The method of claim 3 wherein said throttle valve is positioned by said throttle valve position control based on a function of time within a step of said time division multiplexed etch process.

6. The method of claim 5 wherein said function of time is linear.

7. The method of claim 5 wherein said function of time is nonlinear.

8. The method of claim 1 wherein said closed-loop pressure control algorithm is a proportional, integral and derivative controller, said throttle valve being positioned by said proportional, integral and derivative controller.

9. A method of controlling pressure in a chamber during an etch process, the method comprising:
   placing a substrate in the chamber;
   executing a time division multiplexed etch process within the chamber;
   positioning a throttle valve to a predetermined position within at least one step of said time division multiplexed etch process;
   maintaining said predetermined position of said throttle valve for a predetermined period of time;
   repositioning said throttle valve to a recipe specified position for the remainder of said step of said time division multiplexed etch process; and
   removing said substrate from the chamber.

10. The method of claim 9 wherein said time division multiplexed etch process further comprising:
    depositing a passivation layer on said substrate by means of a plasma;
    etching a material from said substrate by means of a plasma; and
    performing a process loop of repeating the deposition step and the etch step.

11. The method of claim 9 wherein said predetermined position is derived from a recipe position set point.

12. The method of claim 11 wherein said predetermined position is proportional to said recipe position set point.

13. The method of claim 11 wherein said predetermined position is offset from said recipe position set point.

14. The method of claim 9 wherein said predetermined period of time is less than a period of time for said step of said time division multiplexed etch process.

15. A method of controlling pressure in a chamber during an etch process, the method comprising:
    placing a substrate in the chamber;
    executing a time division multiplexed etch process within the chamber;
    controlling a throttle valve through a throttle preset parameter within at least one step of said time division multiplexed etch process;
    evaluating a pressure response of said step compared to a desired pressure response;
    applying a control algorithm to modify said throttle preset parameter step to step of said time division multiplexed etch process based on said evaluation step; and
    removing said substrate from the chamber.

16. The method of claim 15 wherein said time division multiplexed etch process further comprising:
    depositing a passivation layer on said substrate by means of a plasma;
    etching a material from said substrate by means of a plasma; and
    performing a process loop of repeating the deposition step and the etch step.

17. The method of claim 15 wherein said desired pressure response is a step function.

18. The method of claim 15 wherein said control algorithm is a closed-loop pressure control algorithm.

19. The method of claim 18 wherein said closed-loop pressure control algorithm is a proportional, integral and derivative controller, said throttle valve being positioned by said proportional, integral and derivative controller.

20. The method of claim 15 wherein said throttle preset parameter is a throttle position.

21. The method of claim 15 wherein said throttle preset parameter is a preset hold time duration.

22. A method of controlling process execution during an etch process, the method comprising:
    placing a substrate in the chamber;
    executing a time division multiplexed etch process within the chamber;
    modifying an execution timing of a subset of recipe parameters in at least one step of said time division multiplexed etch process; and
    removing said substrate from the chamber.

23. The method of claim 22 wherein said time division multiplexed etch process further comprising:
    depositing a passivation layer on said substrate by means of a plasma;
    etching a material from said substrate by means of a plasma; and
    performing a process loop of repeating the deposition step and the etch step.

24. The method of claim 22 wherein said execution timing is an initiation of set point transition.

25. The method of claim 22 wherein said execution timing is a set point duration.

26. The method of claim 22 wherein said modified execution timing changes an execution order of at least two process variables.

27. A method of controlling pressure in a chamber during an etch process, the method comprising:
   placing a substrate in the chamber;
   executing a time division multiplexed etch process within the chamber;
   controlling a throttle valve through a throttle preset parameter within at least one step of said time division multiplexed etch process;
   evaluating a pressure response of said step compared to a desired pressure response;
   applying a first control algorithm to modify said position preset parameter of said throttle valve step to step of said time division multiplexed etch process based on said evaluation step;
   positioning said throttle valve based on a second control algorithm from step-to-step of said time division multiplexed etch process; and
   removing said substrate from the chamber.

28. The method of claim 27 wherein said time division multiplexed etch process further comprising:
   depositing a passivation layer on said substrate by means of a plasma;
   etching a material from said substrate by means of a plasma; and
   performing a process loop of repeating the deposition step and the etch step.

29. The method of claim 27 wherein said desired pressure response is a step function.

30. The method of claim 27 wherein said first control algorithm is a first closed-loop pressure control algorithm.

31. The method of claim 30 wherein said first closed-loop pressure control algorithm is a first proportional, integral and derivative controller, said throttle valve being positioned by said first proportional, integral and derivative controller.

32. The method of claim 27 wherein said throttle preset parameter is a throttle position.

33. The method of claim 27 wherein said throttle preset parameter is a preset hold time duration.

34. The method of claim 27 wherein said second control algorithm is a second closed-loop pressure control algorithm.

35. The method of claim 34 wherein said second closed-loop pressure control algorithm is a second proportional, integral and derivative controller, said throttle valve being positioned by said second proportional, integral and derivative controller.

* * * * *